(12) United States Patent
Eglit

(10) Patent No.: US 6,483,447 B1
(45) Date of Patent: Nov. 19, 2002

(54) DIGITAL DISPLAY UNIT WHICH ADJUSTS THE SAMPLING PHASE DYNAMICALLY FOR ACCURATE RECOVERY OF PIXEL DATA ENCODED IN AN ANALOG DISPLAY SIGNAL

(75) Inventor: Alexander Julian Eglit, Half Moon Bay, CA (US)

(73) Assignee: Genesis Microchip (Delaware) Inc., Alviso, CA (US)

( * ) Notice: Subject to any disclaimer, the term of this patent is extended or adjusted under 35 U.S.C. 154(b) by 0 days.

(21) Appl. No.: 09/350,204

(22) Filed: Jul. 7, 1999

(51) Int. Cl.[7] .................................................. H03M 1/48
(52) U.S. Cl. ...................................... 341/111; 345/213
(58) Field of Search ........................... 341/111; 348/115, 348/177; 345/530

(56) References Cited

U.S. PATENT DOCUMENTS

| | | | | |
|---|---|---|---|---|
| 4,755,879 A | * | 7/1988 | Hinson | ........................ 348/513 |
| 5,389,859 A | * | 2/1995 | Stessen et al. | ............... 315/367 |
| 5,533,060 A | * | 7/1996 | Kameo et al. | ............... 375/332 |
| 5,910,651 A | * | 6/1999 | Ryvkin | ................... 235/462.25 |

* cited by examiner

Primary Examiner—Peguy JeanPierre
(74) Attorney, Agent, or Firm—Staas & Halsey

(57) ABSTRACT

A digital display unit adjusting the phase of a sampling clock based on the examination of a display data signal contained in a received analog display signal. The phase may be adjusted by determining a boundary between display data portions representing successive pixel data elements. As the boundaries provide the timing information related to the source clock, the phase of the sampling clock can be adjusted when ever the boundaries can be determined accurately. The phase of the sampling clock can be adjusted potentially every sampling clock cycle if the boundaries can be determined. The area for examination can be minimized by first determining an expected boundary based on synchronization signal accompanying the analog display data, and examining only a small area surrounding the expected boundary.

27 Claims, 13 Drawing Sheets

DIGITAL DISPLAY UNIT WHICH ADJUSTS THE SAMPLING PHASE DYNAMICALLY FOR ACCURATE RECOVERY OF PIXEL DATA ENCODED IN AN ANALOG DISPLAY SIGNAL

BACKGROUND OF THE INVENTION

1. Field of the Invention

The present invention relates to digital display units for use in computer systems, and more specifically to a method and apparatus which dynamically adjusting the sampling phase while sampling an analog display signal to recover the encoded digital data.

2. Related Art

Digital display units (e.g., flat panel monitors) are often used in computer systems for displaying images encoded in analog display signals. In a typical situation, a graphics source (typically including a digital to analog converter) generates an analog display signal from pixel data representing an image frame according to well known standards such as VGA or SVGA.

An analog display signal generally contains display data signal and associated synchronization signals. The display data signal may be viewed as a series of successive portions in time domain, with each portion being generated from a pixel data element representing a point of an image. The image portions are typically generated under the control of a source clock, which drives a digital to analog converter (DAC). The DAC generates the analog display data according to the source clock signal.

The manner in which a digital display unit displays images and some problems with such display are described below.

A digital display unit generally recovers the pixel data elements which are encoded in the display data signal of a received analog display signal. The recovery process usually entails generating a sampling clock from the synchronization signals (contained in the analog display signal), and sampling the analog display data according to the sampling clock. Pixel data elements representing an image are generated from such sampling.

In general, the pixel data elements resulting from the sampling need to (at least substantially) equal the pixel data elements from which display data portion of a received analog signal is generated so that the images represented by both sets of pixel data elements are the same. One of the requirements to achieve such equality is that the sampling clock be generated with appropriate phase and frequency such that each pixel data element is recovered as accurately as possible.

At least in some environments such as those based on VGA and SVGA, several challenges may be presented in generating a sampling clock with the appropriate phase and frequency as the synchronization signals accompanying display signals do not contain clocking information for each pixel data element. Instead, a horizontal synchronization signal is typically provided, which generally indicates the transition to a next horizontal line.

Clock recovery circuits (such as phase lock loops) have been implemented to generate sampling clock signals based on the transitions indicated by horizontal synchronization signals. Usually, the phase of the (divided) sampling clock is compared with the horizontal synchronization signals for every line, and the sampling clock is adjusted based on the comparison. The phase of the horizontal synchronization signals typically represents the average phase of the source clock for an entire line.

The phase adjustment of a sampling clock based on infrequent comparisons may not be acceptable in several situations. For example, in the VGA and SVGA environments of above, the source clock may generate non-uniformly spaced (in time domain) pulses due to factors such as phase jitter and frequency drift resulting from, for example, imperfect hardware used in generating the source clock. The non-uniformity in the source clock may not be tracked accurately by the sampling clock.

The absence of proper tracking may result in inaccurate recovery of the pixel data elements encoded in a received analog display signal, particularly when the analog signals are encoded with high resolution images at a high refresh rate. As may be readily appreciated, the pixel processing period (the time duration for encoding a pixel data element in a display signal) is generally short under such circumstances, and there may be a narrow window (in time domain) in which to sample each display data portion representing a pixel data element.

The window is typically narrow because of the limited bandwidth practically present between a graphics source and a digital display unit and the short pixel processing period. If a display data portion representing a pixel is not sampled in the corresponding window, the pixel data element may not be recovered accurately.

The absence of proper tracking typically affects the display quality. For example, display artifacts may be observed on a display screen. The artifacts are generally more visible towards the right end of the screen. In some instances, the artifacts manifest as vertical bars on the displayed images. The artifacts are of particular concern when a graphics source uses imprecise components (e.g., analog PLLs operating in high noise environments) for generating a source clock signal.

To avoid such artifacts and to facilitate accurate recovery of pixel data elements, users of display units are often required to adjust the sampling phase. Typically, an on-screen-display menu is provided to facilitate a user manual adjustment. However, such manual techniques are often cumbersome even for the knowledgeable users, and are thus undesirable.

Therefore, what is needed is a method and apparatus for dynamically adjusting the phase of the sampling clock such that the pixel data elements can be recovered accurately and display artifacts can be avoided.

SUMMARY OF THE INVENTION

The present invention is directed to a digital display unit which displays the images encoded in an analog display signal received from a graphics source. The analog display signal may contain display data signal and associated synchronization signals. Each portion of the display data signal may be generated from a pixel data element. Many such pixel data elements may represent an image frame.

The synchronization signals do not contain the clock for recovering each of the pixel data elements, and accordingly a sampling clock enabling such recovery is generated in the digital display unit in accordance with the present invention. The manner in which the sampling clock is generated in some example embodiments is described below in further detail.

A digital display unit in accordance with the present invention examines the display data signal to determine the deviation in phase of a source clock signal from a sampling clock signal. The phase of the sampling clock is modified to closely track the source clock signal. As the sampling clock tracks the source clock closely, the pixel data elements encoded in the display data signal may be recovered accurately.

In an embodiment, the deviations in phase are determined by examining the display data signal for the boundary of display data portions representing two successive pixel data elements. As the boundaries generally provide the timing information of the source clock signal, the phase of the source clock signal may be compared with that of the sampling clock signal.

In addition, the examined portion (or length) of the display data signal may be minimized by first determining an expected boundary. The expected boundary may be determined based on the synchronization signal accompanying the display data signal. Thus, an aperture covering a small area around the expected boundary can be examined to determined an accurate boundary.

The time difference of the expected boundary and accurate boundary represents the deviation of phase of the sampling clock signal from that of the source clock signal. Thus, the time difference can be used to adjust the phase of the sampling clock signal. In an embodiment, the time difference is passed through a filter to minimize unneeded short term fluctuations.

According an another aspect of the present invention, the expected boundary is determined by taking a few analog timing samples in the aperture. Successive timing samples are compared to determine the actual boundary. In general, transitions in voltage levels (such as a single peak or valley) represent the actual boundaries. At least when the pixel processing period is low, the ease with which a boundary can be determined generally depends on the difference of values of successive pixel data elements in a horizontal line.

According to another aspect of the present invention, a dead zone may be introduced in the middle of the examined aperture. The dead zone may be introduced by making the interval between the timing samples around the expected boundaries longer. Without such dead zone, the phase of the sampling clock may be advanced and retarded during successive clock cycles even though the sampling clock is tracking the source clock within an acceptable limit. Thus, the uncertainly is minimized or eliminated.

Thus, the present invention enables a sampling clock signal to track a source clock signal used to generated a display data signal as the phase of the sampling clock signal is adjusted by examining the display data signal.

Another aspect of the present invention enables the accurate recovery of pixel data elements encoded in an analog display signal as the phase of the sampling clock may be adjusted to closely track a source clock signal using which the analog display signal may have been generated.

Yet another aspect of the present invention enables the phase of a sampling clock to be adjusted to track a source clock signal by determining the boundaries (reflecting the timing information of the source clock) of display data signal portions representing successive pixel data elements, and adjusting the phase of the sampling clock based on the determination of the boundaries.

Another aspect of the present invention minimizes the processing steps required for determining such boundaries by determining an expected boundary using the synchronization signals, and examining an aperture closely surrounding the expected boundary.

One more aspect of the present invention enables the examination of the aperture area by taking a few timing samples in the aperture, and examining the timing samples to determine the accurate boundary.

Yet another aspect of the present invention eliminates the need for analog-to-digital converters (ADCs) for taking the timing samples in an aperture as the accurate boundary is determined based only on analog timing samples.

Another aspect of the present invention enhances the noise immunity of the phase error detection by determining that the display data signal is rising or falling only if the difference of samples is greater than a pre-determined (e.g., programmable) threshold.

Yet another aspect of the present invention avoids or minimizes unneeded phase correction fluctuations around the accurate boundary by introducing a dead zone around the center of the aperture.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

A digital display unit implemented in accordance with the present invention receives and processes an analog display signal generated by a graphics source using a source clock signal. The analog display signal may contain display data signal and associated synchronization signals. The display unit examines the display data signal to determine the timing relationship of a sampling clock in comparison with the source clock signal, and adjusts the phase of a sampling clock based on the determination. The adjustments may be performed potentially once for every clock cycle of the sampling clock.

In an embodiment described below, a digital display unit the timing relationship is determined by examining the display data signal for the boundary of display data portions representing consecutive pixel data elements. The time duration between the boundaries typically represents the time duration between the clock pulses of a source clock signal used for generating the display data signal. Accordingly, the phase of the sampling clock may be adjusted to track any short term fluctuations in the source clock signal.

As a further improvement, a digital display unit may examine a small area ("aperture") around an expected boundary between display data portions representing two successive pixel data elements. The expected boundary may be determined according to the synchronization signals received accompanying the display data signal. By minimizing the examined area, the number of computations (and thus the required hardware) may also be minimized.

The present invention is described below in further detail with respect to several embodiments. However, it is useful to first understand an example environment in which the present invention can be implemented.

2. Example Environment

In general, the present invention can be implemented in any digital display unit. However, the invention has particular application in computer systems. A computer system may be one of, without limitation, lap-top and desk-top personal computer systems, work-stations, special purpose computer systems, general purpose computer systems, network computers, and many others. The invention may be implemented in hardware, software, firmware, or combination of the like.

Figure 1:
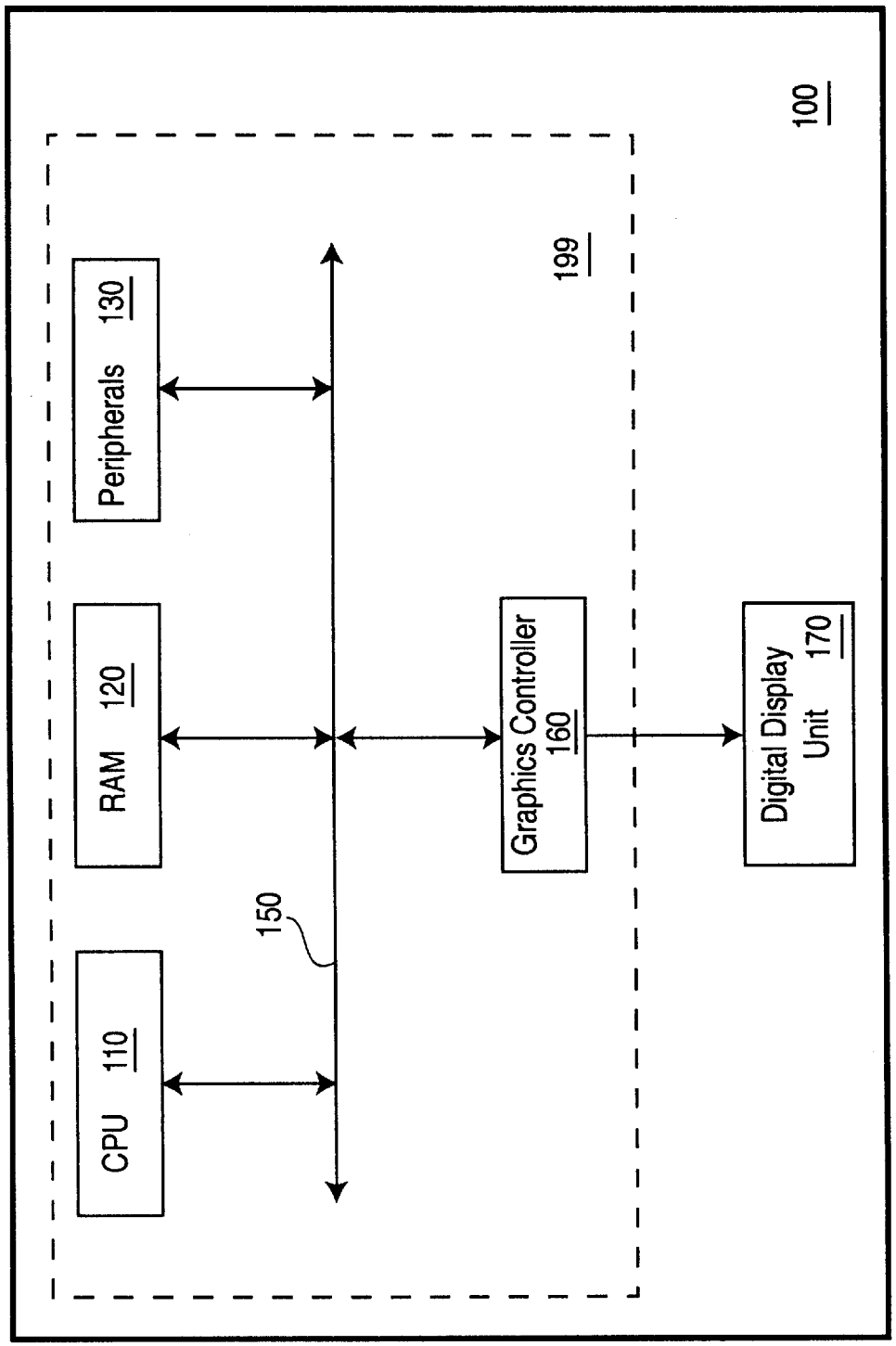
FIG. 1 is a block diagram of a computer system implemented in accordance with the present invention.

FIG. 1 is a block diagram of computer system 100 in which the present invention can be implemented. Computer system 100 includes central processing unit (CPU) 110, random access memory (RAM) 120, one or more peripherals 130, graphics controller 160, and digital display unit 170. CPU 110, RAM 120 and graphics controller 160 are typically packaged in a single unit, and such a unit is referred to as graphics source 199 as an analog display signal is generated by the unit. All the components in graphics source 199 of computer system 100 communicate over bus 150, which can in reality include several physical buses connected by appropriate interfaces.

RAM 120 stores data representing commands and possibly pixel data elements representing a source image. CPU 110 executes commands stored in RAM 120, and causes different commands and pixel data elements to be transferred to graphics controller 160. Peripherals 130 can include storage components such as hard-drives or removable drives (e.g., floppy-drives). Peripherals 130 can be used to store commands and/or data which enable computer system 100 to operate in accordance with the present invention. By executing the stored commands, CPU 110 provides the electrical and control signals to coordinate and control the operation of various components in graphics source 199.

Graphics controller 160 receives data/commands from CPU 110, generates display signals including analog display data and corresponding synchronization signals, and provides both to digital display unit 170. Analog display signals may be generated in modes such as EGA, VGA and SVGA modes as is well known in the relevant arts. Some of the graphics modes and standards are described in detail in a book entitled, "Programmer's Guide to the EGA, VGA, and Super VGA Cards", published by Addition-Wesley Publishing Company, by Richard F. Ferraro, ISBN Number 0-201-62490-7, which is incorporated in its entirety herewith.

The display signal may be in the form of RGB signals and the reference clock signal includes the VSYNC and HSYNC signals well known in the relevant arts. Therefore, three analog display signals (red, green and blue) are generated from each pixel data element. For conciseness, the present invention is described with reference to one display data signal. It should be understood that the description may be applicable to all the three display data signals.

In general, graphics controller 160 first generates pixel data elements of a source image. The pixel data elements for a source image may either be provided by CPU 110 or be generated by graphics controller 160 in response to commands from CPU 110. Graphics controller 160 typically includes a digital to analog converter (DAC) for generating an analog display signal based on the pixel data elements in a known way. The source images are encoded at an encoding rate in the display signal. The encoding rate generally determines the image refresh rate, at least when the images are displayed in an analog display unit.

Digital display unit 170 receives a display signal from graphics controller 160, and displays the source images encoded in the display signal. In general, display unit 170 recovers pixel data elements representing a source image and refreshes a display screen (contained within display unit 170) based on the recovered pixel data elements. Accurate recovery of the pixel data elements may entail generating a sampling clock with appropriate phase and frequency. Digital display unit 170 may examine the display data signal and adjust the phase of the sampling clock as described with reference to several example embodiments below.

3. Method

Figure 2:
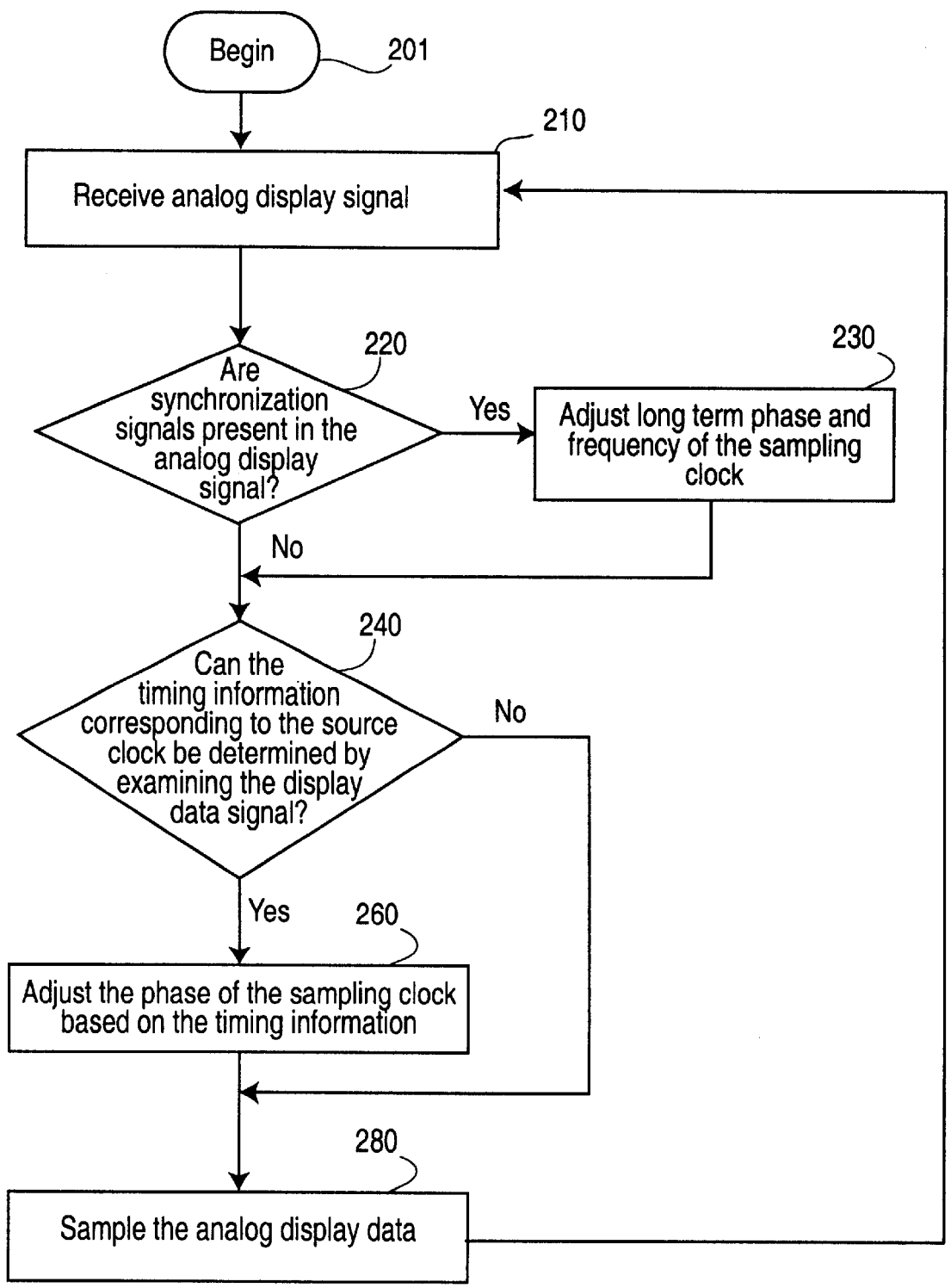
FIG. 2 is a flow-chart illustrating a method according to the present invention.

FIG. 2 is a flow-chart illustrating a method in accordance with the present invention.

The flow-chart is described with reference to FIG. 1 for clarity. The method starts in step 201, in which control passes to step 210. In step 210, digital display unit 170 may receive an analog display signal from graphics source 199.

The analog display signal contains analog display data encoding pixel data elements representing an image frame.

In step 220, digital display unit may 170 determine whether synchronization signals are present in the analog display signal. Typically, the synchronization signals are received in the form of vertical of horizontal synchronization signals in the VGA types of computer graphics environments. If synchronization signals are determined to be present, control passes to step 230, or else control passes to step 240.

In step 230, digital display unit adjusts the long term phase and frequency of the sampling clock. Typically, such adjustment is per horizontal line or frame (i.e., with a lot less frequency than per pixel adjustment provided by an aspect of the present invention). The adjustment may be performed, for example, by using phase lock loops as is well known in the relevant arts.

In step 240, digital display unit 170 determines whether timing information of the sampling clock relative to the source clock can be determined based on an examination of the display data signal. One of several possible approaches may be used for the determination of the timing information. The timing information may be determinable only during some clock cycles of the sampling clock. Accordingly, if timing information is determined to be present in step 240, control then passes to step 240, or else control passes to step 260.

In step 260, the phase of the sampling clock is adjusted according to the determined timing information. In general, the phase of the sampling clock is adjusted to have the sampling clock track the source clock closely. Control passes to step 280 from step 260. In step 280, the analog display data is sampled according to the sampling clock with any phase adjustments performed in step 260. Due to the phase adjustments performed based on examination of the display data signal, the sampling clock may accurately track the source clock, and the pixel data elements may be recovered accurately. Some example implementations of the method and improvements suitable in some environments are described below.

4. Digital Display Unit

Figure 3:
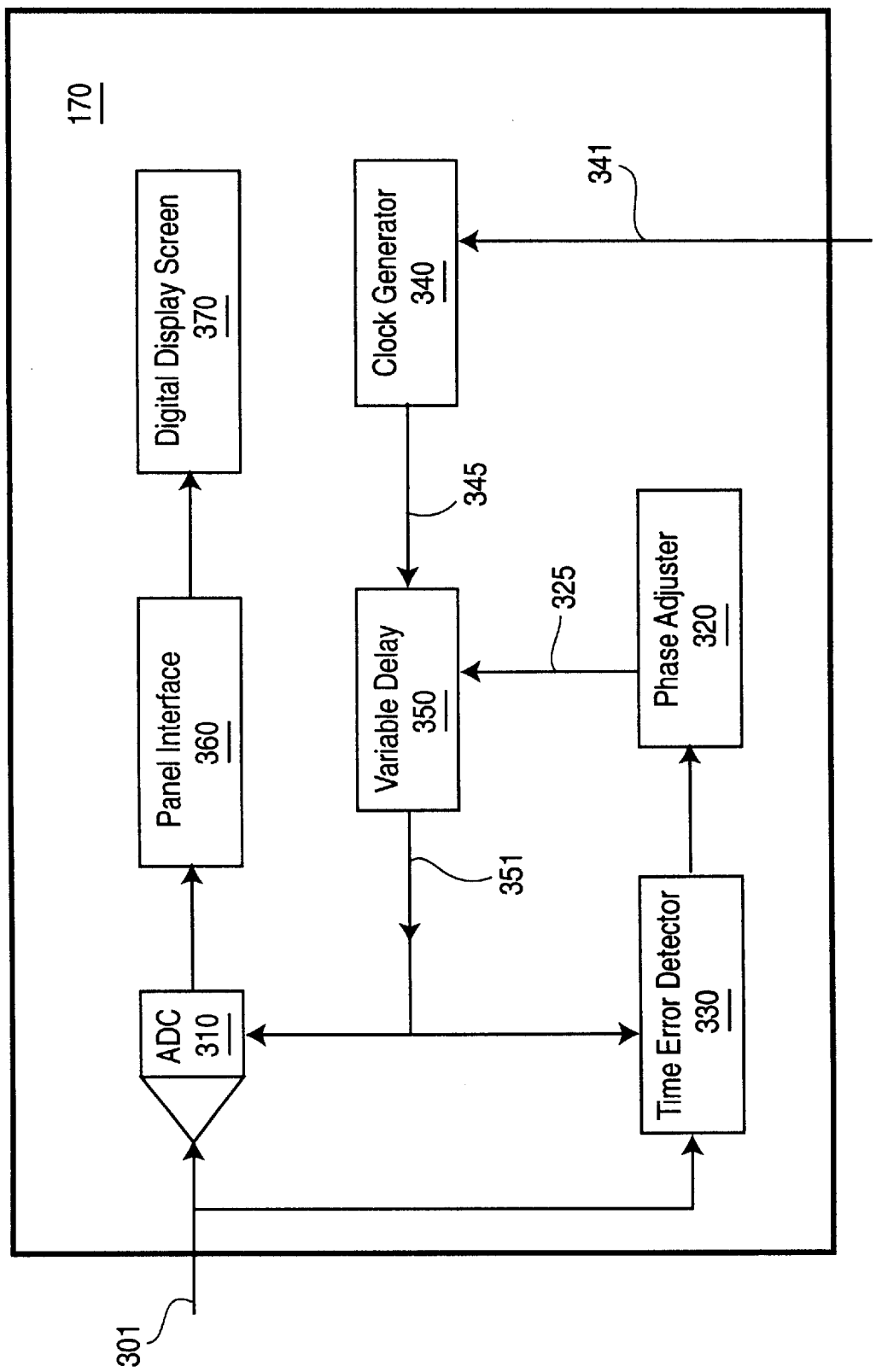
FIG. 3 is a block diagram of a display unit implemented in accordance with the present invention.

The details of an embodiment of digital display unit 170 are depicted in FIG. 3. Digital display unit 170 may include analog to digital converter (ADC) 310, phase adjuster 320, time error detector 330, clock generator 340, variable delay 350, panel interface 360, and digital display screen 370. Each component of digital display unit 170 is described below in further detail.

Digital display screen 370 is characterized by discrete points commonly termed as pixels. Each pixel can generally be controlled individually, and all the pixels may be activated to various degrees to display an image on display screen 370. Panel interface 360 receives digital pixel data elements representing an image from ADC 310, and generates electrical signals compatible with the implementation of display screen 370 to display images represented by the pixel data elements. The manner in which the pixel data elements are recovered accurately is described below in further detail.

Clock generator 340 may generate a synchronized clock signal based on the synchronization signals received on line 341. In many situations, it is generally desirable that the synchronized clock signal have the same phase and frequency as a source clock used to generate the accompanying display data signal. The frequency and phase of synchronized clock signal 345 may be determined by the synchronization signals 341. In an example embodiment, the synchronization signals contain horizontal synchronization signals. The embodiment is described in further detail in U.S. Pat. No. 5,796,392, Entitled, "A Method and Apparatus for Clock Recovery in a Digital Display Unit", and issued on Aug. 18, 1998.

In general, when the received synchronization signals provide timing information for only a group of pixel data elements (e.g., for a complete line), the timing information usually represent the average clock duration for all the elements in the group. Many times, such average clock duration may be inadequate in accurately recovering the pixel data elements, and may thus be unacceptable in certain situations. A phase adjustment circuit may be used to adjust the phase of the sampling clock to track the source clock closely as described below. Time error detector 330, phase adjustor 320, and variable delay 350 represent an example implementation of the phase adjustment circuit.

Time error detector 330 may examine the display data received on line 301 to determine timing information of the synchronized clock signal 345 relative to source clock signal. Time error detector 330 may be implemented in a combination of hardware, software, and/or firmware, but generally needs to include sufficient structure to examine the signal level on the analog display data to determine the timing information of the source clock. Several such structures will be apparent to one skilled in the relevant arts by reading the disclosure herein, and at least all such structures are contemplated to be within the scope and spirit of the present invention. Some example structures and approaches are described below.

In an embodiment described below, time error detector 330 generates a phase error signal indicating whether the phase of the source clock is earlier than, later than or synchronized with clock signal 345 received from clock generator 340. The phase error signal from time error detector 330 can be in one of several forms. For example, an integer may be used for identifying the extent of phase lead/lag. In the alternative, a signal line may be asserted a time duration proportionate to the extent of lead or lag. In yet another alternative, a pulse may be generated to merely indicate whether the signals have lag, lead or synchronized relationship.

Phase adjustor 320 receives the phase error signal from time error detector 330 and determines the extent of phase correction during a present clock cycle (of sampling clock 351). Phase adjustor 320 may operate as a filter to ensure that the phase adjustment does not unduly oscillate from lead to lag and vice versa unnecessarily. Phase adjustor 320 may be implemented in one of several ways. For example, phase error 320 may generate a number or analog signals representing the phase correction to be performed on path 325. An embodiment of phase adjustor is described below in further detail.

Variable delay 350 adjusts the phase of synchronized clock signal 345 (or sampling clock) according to the delay indicated on path 325. Variable delay 350 may be implemented in a known way. In one embodiment, delay lines of multiple taps may be used to delay synchronized clock signal 345, and the output one of the taps may be provided as sampling clock 351 depending on a number received on path 325.

Even though sampling clock 351 and synchronized clock signal 345 are described as distinct clock signals, phase adjustor 320 may be viewed as adjusting the phase of the sampling clock as will be apparent to one skilled in the relevant arts. In addition, the phase adjustment may be performed by interfacing with clock generator in a closed-loop approach without departing from the scope and spirit of the present invention as will also be apparent to one skilled in the relevant arts.

Analog-to-digital converter (ADC) 310 samples the display data signals received on line 301 to generate pixel data elements representing an image. The sampling is performed according to sampling clock 351 generated in accordance with the present invention. As the phase of the sampling clock may be adjusted several times within a horizontal line, the pixel data elements may be recovered accurately. The manner in which the sampling phase may be modified in some example situations is described in further detail below.

6. Example Approach for Determining Timing Information

Figure 4:
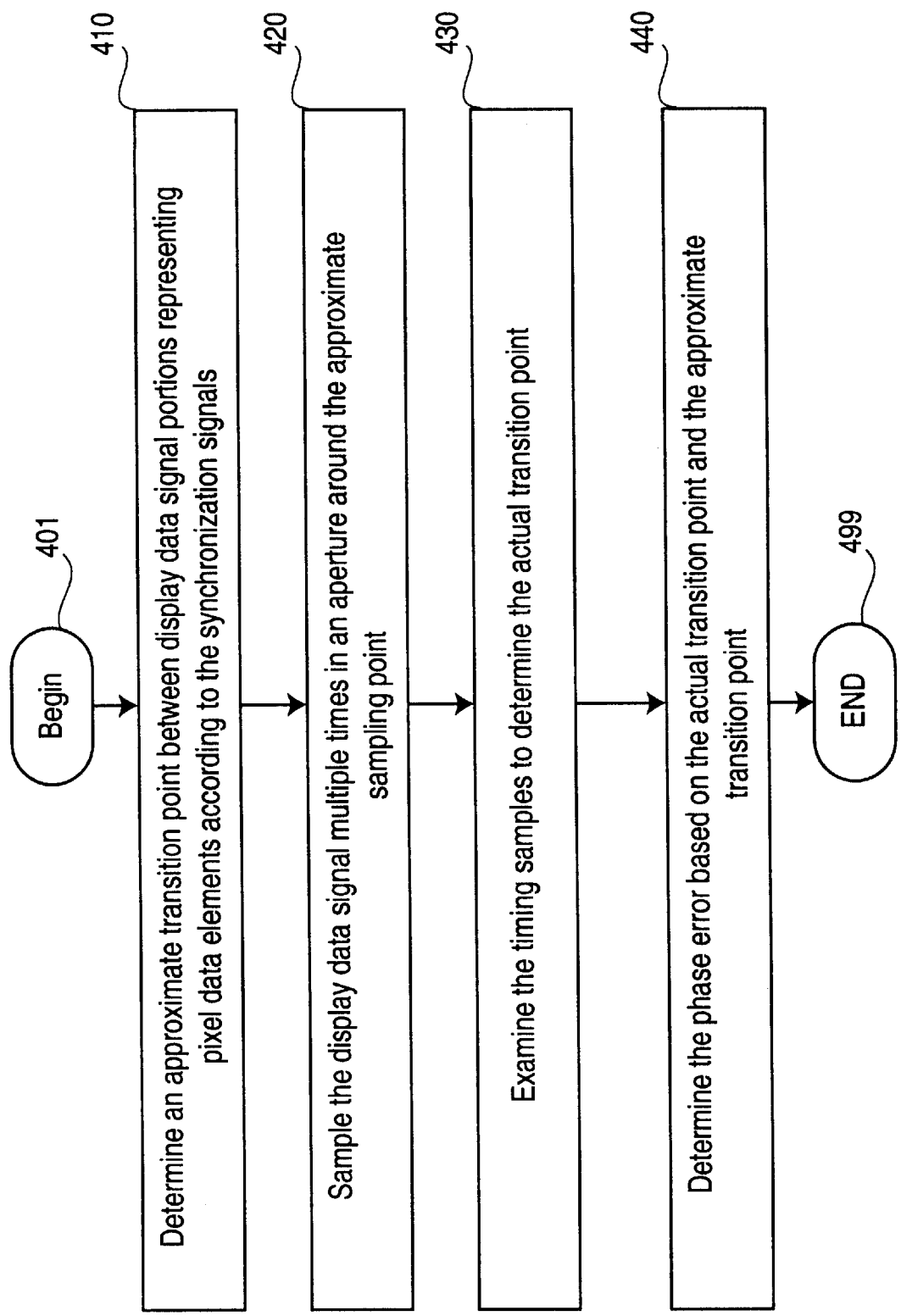
FIG. 4 is a flow-chart illustrating the actions that may be performed to adjust the phase of a sampling clock by examining the analog display data signal.

FIG. 4 is a flow-chart illustrating an example approach for determining the timing information of the sampling clock relative to the source clock in accordance with the present invention. The steps of FIG. 4 may correspond to step 240 of FIG. 2. In step 410, an expected boundary between display data portions representing consecutive pixel data elements may be determined first. With respect to FIG. 3, the boundary may be determined by synchronized clock signal 345 (or sampling clock prior to adjustment) generated based on synchronization signals contained in the received analog display signals.

Continuing with reference to FIG. 4, in step 420, a few timing samples are taken in an aperture containing the expected boundary. In the present application, the samples taken for purpose of determining the timing information are referred to as 'timing samples' while the samples taken for recovering pixel data elements are termed as 'pixel samples'.

In step 430, the timing samples are examined to determine an accurate boundary between display data portions representing successive pixel data elements. The determination of the accurate boundary is illustrated with some examples below. The determination of boundaries can be performed using one of several structures well known in the relevant arts. For example, digital combinatorial logic can be applied to compare samples in the form of numbers. However, such an approach may require expensive ADCs (for sampling at a high frequency) and combinatorial logic, and such overhead may be unacceptable in some situations. An example approach that does not require such overhead is described below in further detail.

In step 440, the expected boundary of step 410 is compared with the accurate boundary to determine whether the phase of sampling clock 351 has to be adjusted. In general, the phase of the sampling clock may be varied to keep the expected boundary as close as possible to the accurate boundary. If the expected boundary coincides with or within an acceptable distance from the accurate boundary, no phase adjustment may be required. Steps 410–440 may be repeated for each pixel data element.

To the extent timing information can be extracted from the corresponding display signal portion, the phase may be adjusted potentially for each cycle of the sampling clock. Accordingly, the pixel data elements representing an image may be recovered accurately in accordance with the present invention. Some example implementations of the steps of FIG. 4 are described below in greater detail.

6. Graphs Illustrating Determination of Timing Information

Figure 5:
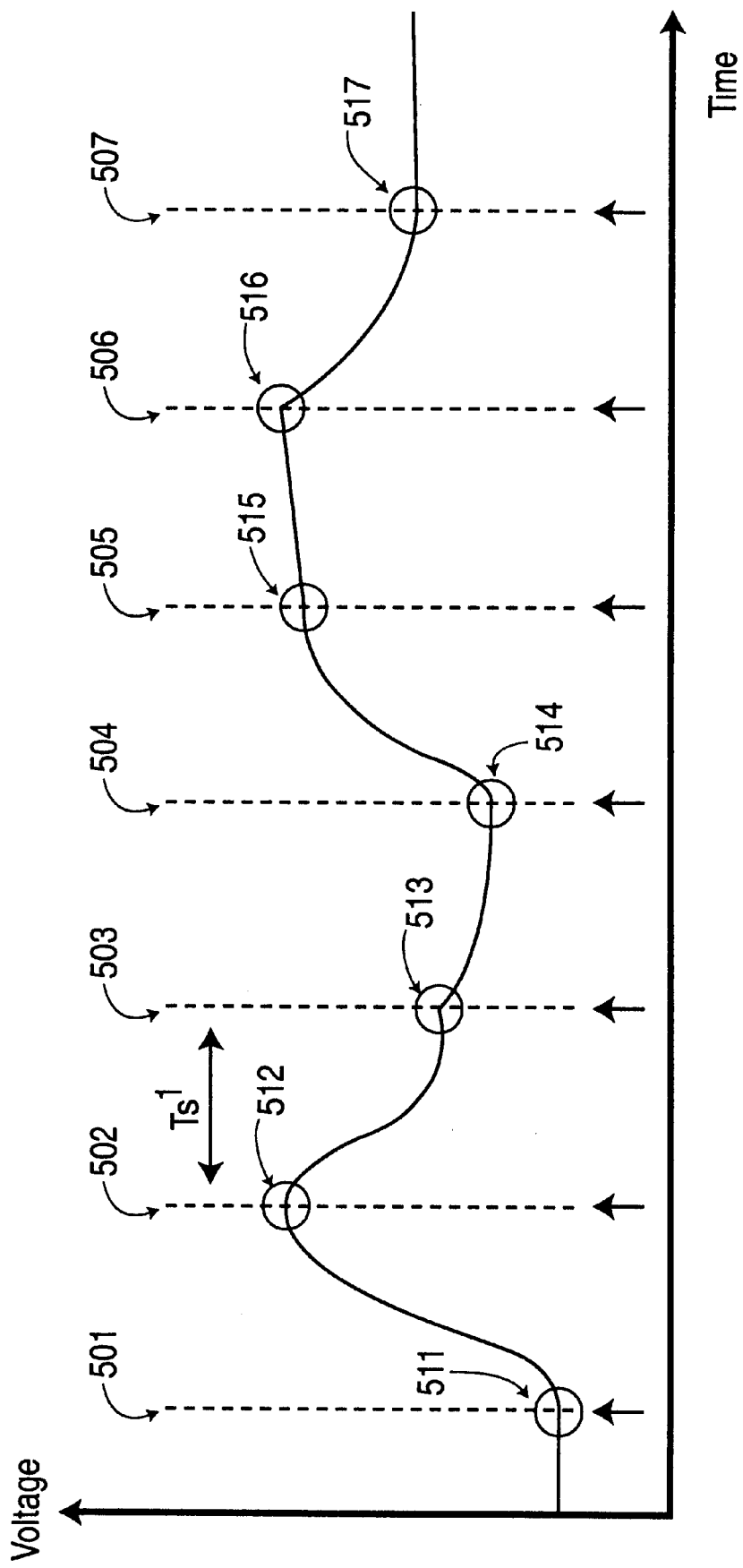
FIG. 5 is a graph illustrating an analog display data signal as a function of time.

An example approach for adjusting the phase of the sampling clock is illustrated with reference to FIGS. 5 and 6A–6F. FIG. 5 is a timing diagram illustrating the voltage (V) level of a display data signal as a function of time (T). In the diagram, the expected boundaries between display signal portions representing pixel data elements are shown at time points 501–508. Accordingly, the display data portion between each pair of time points encodes a pixel data element.

According to an aspect of the present invention, only parts of the display data signal are examined to determine whether the phase of the sampling clock needs to be adjusted. Signal portions 511–517 represent such examined portions. As may be readily observed, only small portions of the display data signal are examined for phase adjustment. In addition, the examined portions may be around the expected boundaries determined by synchronized clock signal 345. As the examined portions are relatively short, the processing requirements may also be minimized.

The manner in which portions 511–517 may be examined to determine the phase adjustment of the sampling clock are illustrated with general reference to FIGS. 6A–6F. For example, FIGS. 6A, 6C, and 6F may respectively represent portions 512,514 and 517 of FIG. 5. In each of the FIGS. 6A–6F, five timing samples are shown. The examined portions are also referred to as 'apertures' in the present application.

Five timing samples are shown in each aperture for illustration. The extreme left and right time points define the aperture in the respective Figures. For example, time points 611 and 615 define the aperture in FIG. 6A. The middle points (613, 623, 633, 643, 653, and 663) may be designed to be synchronous with expected boundary (502–507).

The timing samples in each aperture may be examined to determine the accurate sampling point. For example, the peak (619) of FIG. 6A may be deemed to be the accurate sampling point as the display signal portion before peak 619 may be assumed to be related to a pixel data element represented between time points 501 and 502, and the display signal portion after peak 619 may be assumed to be related to pixel data element represented between time points 502 and 503.

In general, when successive pixel data elements represent values with substantial difference, the boundary is easily determinable. On the other hand, if the successive pixel data elements represent close values, the boundaries may be hard to determine. For example, boundary may not be determinable in portion 515 of FIG. 5 as the difference of the pixel data value of the surrounding the examined portion is not substantial.

Figure 6B:
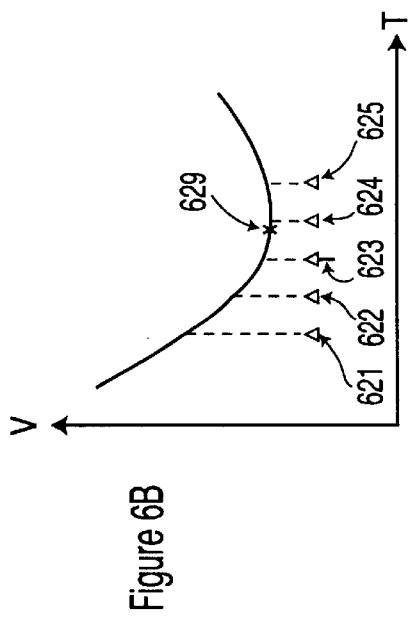
FIGS. 6A–6F are graphs of a display data signal as a function of time illustrating the manner in which the display data signal can be examined to adjust the phase of the sampling clock.
Figure 6D:
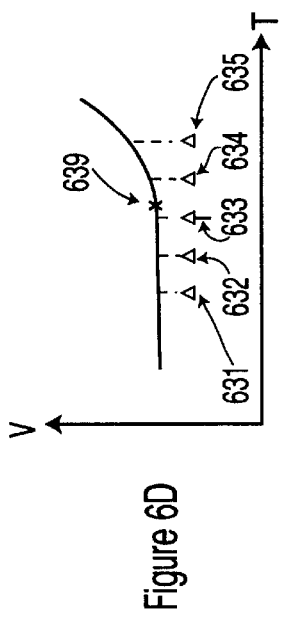
Figure 6F:
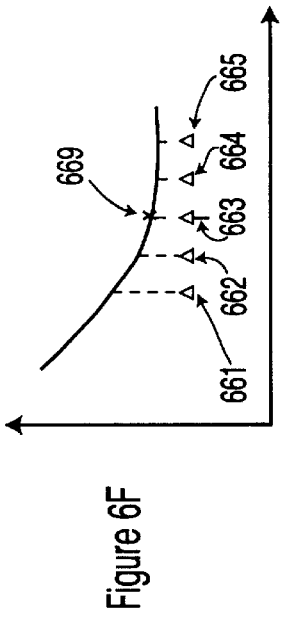
Figure 6A:
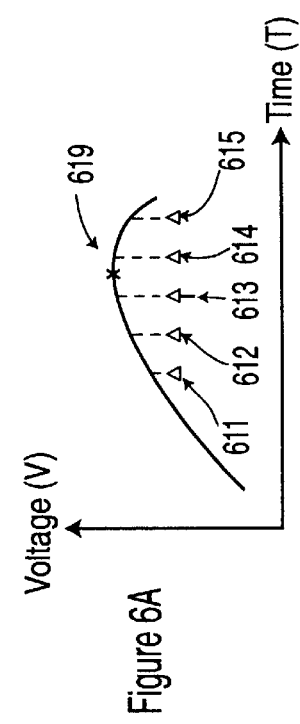

FIGS. 6A–6F illustrate some example patterns from which boundaries can be easily determined. As may be appreciate by visual examination, point 619 of FIG. 6A represents a peak, and may thus be deemed to be an accurate boundary. A peak is generally encountered if the earlier pixel represents a substantially greater value (for the encoded pixel data element) that the later pixel.

Point 629 of FIG. 6B represents a valley, and may be deemed be an accurate boundary. A valley is generally encountered if the the earlier pixel represents a substantially smaller value that the later pixel. Similarly, points 639 (a flat level followed by rising level), 649 (flat level followed by falling level), 659 (rising level followed by flat level), and 669 (falling level followed by flat level) may be deemed to be accurate boundaries in the respective scenarios. Other patterns may also be used in the determination of the boundaries as will be apparent to one skilled in the relevant arts based on the disclosure herein.

It should be appreciated that the actual boundaries typically track the timing of the source clock signal. Therefore, the phase of the sampling clock may be adjusted to track the source clock signal based on the determination of the actual boundaries. In the situations of FIGS. 6A–6F, if the expected boundary is earlier than the accurate boundary, the phase of the sampling clock may need to be advanced. Thus, phase may need to be advanced in FIGS. 6A–6D.

Figure 6C:
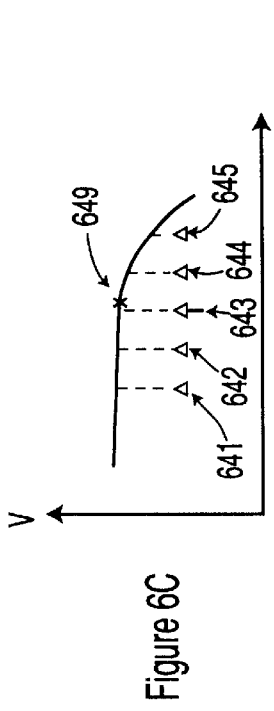
Figure 6E:
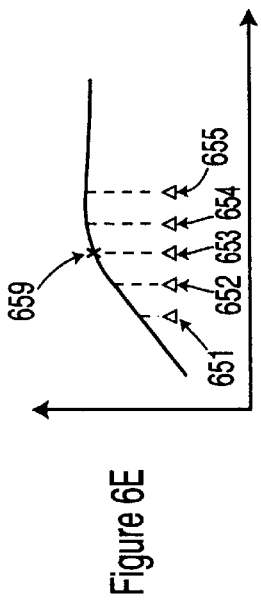

When the expected boundary 653 is ahead of the accurate boundary 659 as in FIG. 6E, the phase of the sampling clock may need to be retarded. However, in the case of FIG. 6F, as the expected boundary coincides with the accurate boundary, no phase adjustment may need to be made.

Thus, using the approaches of above, one can implement several embodiments to generate a sampling clock in accordance with the present invention. Some example implementations for determining whether and how to adjust the phase of the sampling clock are described below in further detail.

7. Circuit for Determining the Accurate Boundary

Before describing the circuit in detail, it is helpful to understand the conceptual framework underlying the circuit. In an embodiment described below, each pair of adjacent timing samples of FIGS. 6A–6F may be compared to generate a 1 if the later sample is greater than the earlier sample, and a 0 otherwise. Thus, a 1 indicates a rising signal and 0 indicates a falling signal. As five timing samples are shown in each Figure, four comparisons may be generated and the four bits resulting from such comparisons may be termed as a comparison pattern.

Thus, comparison patterns of 1110 and 0001 will respectively result in the case of FIGS. 6A and 6B. Each comparison pattern may be examined to determine the actual boundary. In general, the patterns are examined for peaks and valleys. A peak or valley may be referred to as an extremum. If a single extremum is found to be present, that extremum may be determined to be the accurate boundary.

In one embodiment, comparison patterns of 0000 or 1111 may be ignored as the extremum is absent or outside of the aperture. When a comparison pattern of 0111 or 1000 is generated, the sampling phase is advanced. When a comparison pattern of 0011 or 1100 is generated, the extremum coincides with the expected boundary, and no phase correction may be necessary. When a comparison pattern of 0001 or 1110 is generated, the sampling phase may be retarded. Other comparisons may be ignored as representing noise.

Figure 7:
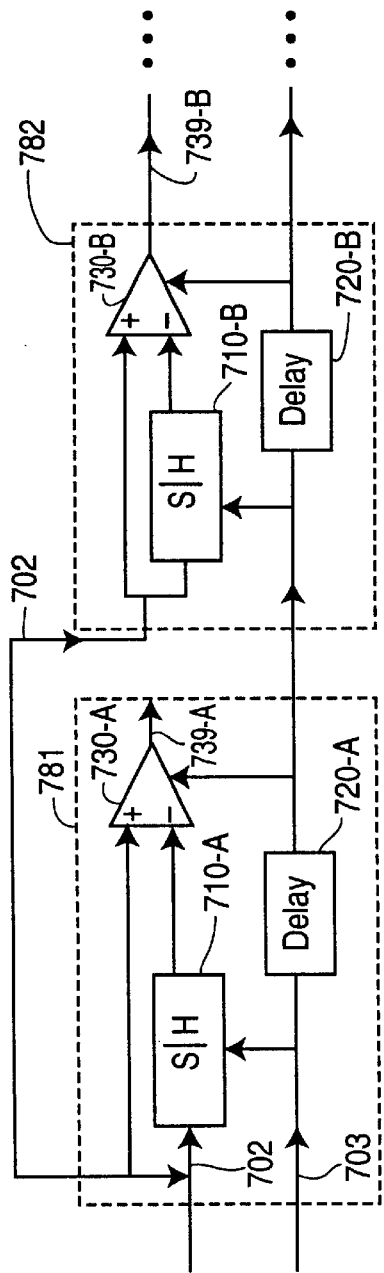
FIG. 7 is a block diagram of a circuit illustrating an example implementation for comparing two samples on the display data signal representing a pixel data element.

FIG. 7 is a block diagram illustrating a circuit for generating the comparison patterns in accordance with the above noted frame work. This circuit generates the patterns without requiring ADCs as may be suitable at least in some environments. FIG. 7 is shown only with two comparison blocks 781 and 782 for conciseness. However, a typical circuit includes the same number of comparison blocks as the number of comparisons to be performed. Each comparison block generates a single bit depending on the result of the comparison as described below.

Comparison block 781 may include sample and hold (S/H) 710-A, which samples an analog display signal portion received on line 702 according to a clock signal received on line 703. The clock signal can be either the sampling clock signal (351) or the clock signal (345) generated by clock generator 340. Comparator 730-A receives as an input the signal level stored in S/H 710-A and the analog signal received on line 702, and compares the two analog timing samples. The output of comparator 730-A equals 1 if the analog signal on line 702 is greater than the signal received from S/H 710-1, and equals 0 otherwise. Thus, comparison block 781 generates one bit of a comparison pattern.

It may be noted that the samples compared by comparison block 781 represent samples of analog display data with a time difference introduced by delay 720-A. That is, with reference to FIG. 6A, the samples may be taken at time points 611 and 612 assuming delay 720-A introduces a delay equal to the time difference of points 611 and 612.

Comparison block 782 may compare the samples at time points 612 and 613 of FIG. 2 assuming delay 720-B introduces a time delay equal to the time delay between time points 612 and 613. Specifically, S/H 710-B stores an analog timing sample at time point 612 as the clock signal is delayed by delay 720-A. When delay 720-B generates a delayed edge, the analog timing sample received on the positive input of comparator 730-B corresponds to the sample at time point 613 in the present illustrative example.

Two additional comparison blocks (not shown) may be employed to generate the other two samples in the example scenario of FIG. 6A. It should be understood that delays 720-A and 720-B may introduce unequal delays and a different number of samples may be used for correcting the phase of the sampling clock. Some considerations in the selection of delays are described below.

The bits of the comparison pattern thus generated, may be used to determine whether to adjust (advance or retard) the phase of the sampling clock. In one embodiment, a simple memory based lookup scheme may be implemented, which generates as output data indicating whether the phase of the sampling clock has to be advanced, retarded or left unchanged. The implementation of such an embodiment will be apparent to one skilled in the relevant arts at least based on the disclosure herein. It should be further noted that a larger number of bits may be employed in the comparison pattern, and the deviation of the expected boundary from an extremum may be used to determine the extent of phase correction.

Thus, using the embodiment(s) of above, the phase of a sampling clock can be adjusted potentially every sampling clock cycle. However, the above-described approach for phase adjustment may not be suited in some situations. For example, if a display data signal is flat (e.g., in portions 511 and 517) in a portion of the sampled aperture, the comparison blocks of above may indicate that the signal is rising or falling as the output is a binary number, unable to accommodate a third state. The absence of this third state may lead to erroneous basis in the phase adjustment in the above noted embodiment of FIG. 7.

The results may also be erroneous in situations when the display data signal is rising or falling at a minimal level to be less than the threshold levels typically present in practical comparison circuits. Such may be the situation at point 515 of FIG. 5 as the later pixel is shown to have only a slightly higher value than the earlier pixel. Accordingly, an alternative embodiment is described below, which provides an indication of when the analog display signal exhibits (substantially) flat characteristics in the aperture.

However, the embodiment of FIG. 7 may have several advantages also. For example, the amount of hardware required may be minimal compared to that in the alternative embodiments described below. In addition, environments such as computer graphics may contain large contrast successive points for accurate phase adjustment, and the number of such adjustments may provide displays of adequate quality in some environments. The description is now continued with the alternative embodiments which overcome some of the problems of the circuit of FIG. 7.

8. Alternative Embodiment for Determining Boundary

Figure 8:
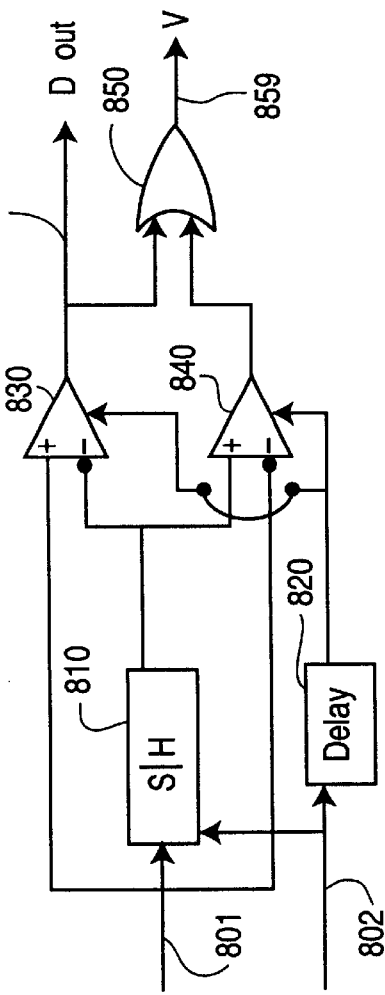
FIG. 8 is a block diagram of a circuit illustrating another example implementation for comparing two samples on the display data signal representing a pixel data element.

FIG. 8 is a block diagram illustrating an alternative embodiment of determination block 800 in accordance with the present invention. Determination block 800 indicates whether a first analog timing sample is greater than, equal to, or less than a second analog timing sample. It may be noted two analog timing samples may be considered to be equal in voltage level if the difference is less than a threshold level determined by the specific implementation. The manner in which the output of determination block 800 can be used for adjusting the sampling phase is described in the sections below in further detail.

Sample and hold (S/H) 810 stores an analog timing sample (i.e., voltage level) from input analog display data received on line 801 at a time point determined by clock signal 802. Clock signal 802 may correspond to either the sampling clock (351) or the synchronized clock signal (345). Delay 820 delays the clock signal by a pre-set delay time, and sends the delayed clock signal to comparators 830 and 840.

Comparator 830 subtracts the sample in S/H 810 from the delayed sample received on line 801, and comparator 840 subtracts the delayed sample received on line 801 from the sample in S/H 810. Comparators 830 and 840 may be designed to generate a 1 on the output only if the difference exceeds a threshold voltage level, which may ensure that adjustments are not performed in the presence of small fluctuations in voltage levels caused by noise. OR gate 850 receives as inputs the outputs of the two comparators, and generates a 1 if at least one of the inputs has a logical value of 1.

Output values of 0 and 0 respectively on $D_{out}$ (line 839) and V (line 859) would indicate that the signal is flat (i.e., no change in signal voltage level), values of 0 and 1 would indicate that the display data signal is falling, values of 1 and 0 would generally not occur, and values of 1 and 1 indicate that the signal is rising. In the examples of FIGS. 6A–6C, four determination blocks may be used. The determination blocks may be implemented using other types of components as well. For example, a dual-threshold comparator may be used instead of two comparators 830 and 840.

The outputs of the determination blocks may be examined to determine the actual boundaries. Due to the three states (flat, rising and falling) in each comparison result, the actual boundary may be determined more accurately compared to the approach of FIG. 7. It may be noted that the approach based on FIG. 8 addresses all the cases of FIG. 7, and provides for better determination of the phase adjustment in many other cases. In addition, the approach of FIG. 8 is generally less sensitive to noise because of the use of comparators with thresholds. Accordingly, an approach based on FIG. 8 may be more robust.

The eight bits representing the four comparisons may again be fed into a table in memory, with the output representing whether the sampling clock needs to be advanced, retarded or unchanged. In addition, a more samples than five can be taken to increase the accuracy of the time error detector, and to further indicate the extent of the phase adjustment. However, the table based approach may consume undesirably large memory.

Accordingly the eight bits of the output of determination blocks 800 may be processed to determine whether the phase of the sampling clock needs to be adjusted. One of several structures can be employed to examine the output of determination block 800 as will be apparent to one skilled in the relevant arts by reading the description herein. Such structures are contemplated to be within the scope and spirit of the present invention. An example circuit which overcomes these limitations is described below in further detail. However, some general considerations in the design of the time error detector are noted first.

9. Some Considerations in the Design of Time Error Detector

Some general consideration in an example embodiment are illustrated with reference to FIG. 6A. It may be noted that the accuracy of adjustment of the phase of the sampling clock can be generally increased by using more timing samples for a given width of the aperture. In addition, the time delay between timing samples within the aperture need not be equal. For analysis and illustration, it will be assumed that t2 represents the time delay between two timing samples 611 and 612, and also between two timing samples 614 and 615. Similarly, the time between two timing samples 612 and 613, and also between 613 and 614 may be assumed to be t1.

The aperture AP in FIG. 6A may be computed as:

$$AP=2\times(t1+t2) \qquad \text{Equation (1)}$$

The region (as a function of time) in which the expected boundary 613 is earlier than the accurate boundary 619 may be termed as an early (E) region. The region in which expected boundary 613 is later than the accurate boundary may be termed as late (L) region. The region during which the accurate boundary may be determined to coincide with the expected boundary 613 may be termed as OK region (O).

Figure 9A:
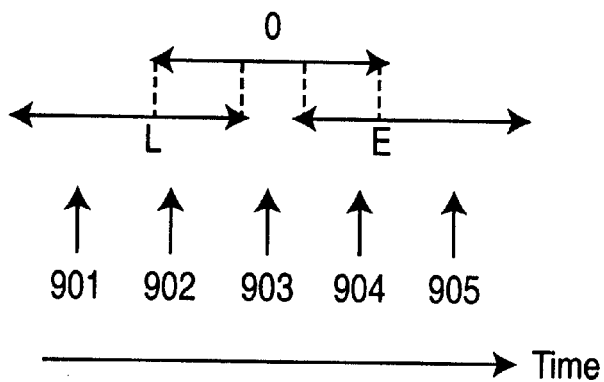
FIG. 9A is a graph illustrating the overlap of early, late and OK which respectively indicate whether the phase of the sampling clock needs to be retarded, advanced or unchanged.

Due to the finite number of timing samples taken within the aperture, there is generally an overlap between the L and O regions, and between O and E regions as illustrated with reference to FIG. 9A. There are shown five samples 901–905. Assuming the expected boundary is around the middle point 903, the O region is shown around the point O. When a finite number of samples are taken in the aperture (between time points 901 and 905), there is an overlap between the adjacent regions as depicted in FIG. 9A.

The overlap noted above combined with potential asymmetry around extremums may lead to uncertainty (unpredictable performance) in operation of the time error detector 330. Specifically, due to this phenomenon, the sampling phase may be advanced and retarded even though no phase adjustment may be required. To clarify with some examples, if the slew rate (slope) before a peak is lower than the slew rate after the peak, the peak location may be delayed from the center in between the samples by certain percentage of sample spacing and still appear to happen in this particular timing sample interval.

Similarly, if the slew rate falls after an extremum, the peak may move happen earlier and still the time error detector 330 may determine it is in the same timing sample interval. Thus, the asymmetry creates a region of uncertainty inside the timing sampling interval which may not be resolved accurately by the time error detector 330 operating merely in accordance with the above description.

Figure 9B:
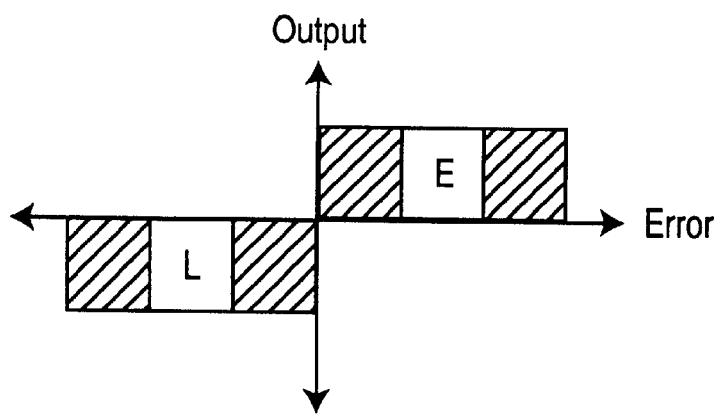
FIG. 9B is a graph of a transfer function illustrating the manner in which the phase adjustments may be unnecessarily fluctuate due to the overlap of the OK region with early and late regions.

The uncertainty may have undesirable effects on the operation of the time error detector 330. For example, it may cause the different regions of the time error detector 330 transfer characteristic to overlap as illustrated with reference to FIG. 9B, which is a graph illustrating the transfer characteristics without the introduction of a dead zone (described below). The phase error is shown on X-axis and the output is shown on Y-axis. As only three outputs (early, late and OK states) are generated, only three values of the Y-axis are shown used. When the phase error is negative, an output of −1 is shown, and when the phase error is positive an output of +1 is shown, otherwise the output remains at zero (no phase correction necessary).

As may be readily observed, the OK region overlaps with both the early and late regions as shown with shading around the origin of the graph. The effect may be that, depending on the asymmetry of the signal, the same peak location maybe resolved, for instance, as early or OK.

Such an uncertainty may be dependent on the detector difference threshold (i.e. the threshold used to quantize the difference into rising/flat/falling values described above). The reduction of the threshold may cause the peak location to deviate more from the center of the sampling interval, and thus increase the uncertainty (hence, region overlap). Conversely, the more coarse comparison with higher thresholds (and, thus, lower sensitivity) reduces the uncertainty and overlap.

Thus, it should be appreciated that the threshold selection affects not only the noise immunity and sensitivity of the detector, but also the amount of uncertainty in its transfer characteristic. Therefore, there may be a practical limit of how far the sensitivity should be increased before the noise immunity suffers and the regions overlap may introduce the systematic error at the output of time error detector 330 depending on the slew rate change around the extremum. On the other hand, lowering sensitivity unnecessary will reduce the rate of extracted timing error samples thus negatively affecting the performance of the system.

The optimal thresholds may be determined experimentally or by simulations depending on the system. As an example, for the VGA-compatible display with nominal full scale swing of 700 mV the threshold of 10 to 50 mV may be recommended. It may be further noted that the overlap between the regions depends on the bandwidth of the system (or, in order words, maximum slew rate of the incoming analog signal) and the comparator thresholds.

As a result, the detector aperture and/or timing sampling intervals (t1 and t2 in our example) may be changed without affecting the amount of uncertainty. This allows implementation of time error detector 330 in which the sampling intervals track the sampling clock frequency, thus keeping the relative aperture of time error detector 330 constant.

10. Reducing the Uncertainty

From the above description, it may be readily appreciated that O region may overlap with both the E (early) and L (late) regions. This may result in the output of time error detector 330 fluctuating around zero depending on the asymmetry of every transition of the input signal. Such fluctuations may be suppressed by a low pass filter in a control loop (or in feed forward branch in open loop architecture case). However, this may require a filter with lower cutoff frequency and larger group delay which may be undesirable in some systems.

An alternative approach may be to reduce these fluctuations by introducing dead zone in the middle of the time error detector 330 transfer characteristic. Dead zone may be conveniently introduced by inserting additional delay in the middle of the detector delay chain. This effectively adds another sample. However, this is a virtual sample because it is not used for extremum location detection directly, but to bridge the time gap in the detector aperture.

Figure 9C:
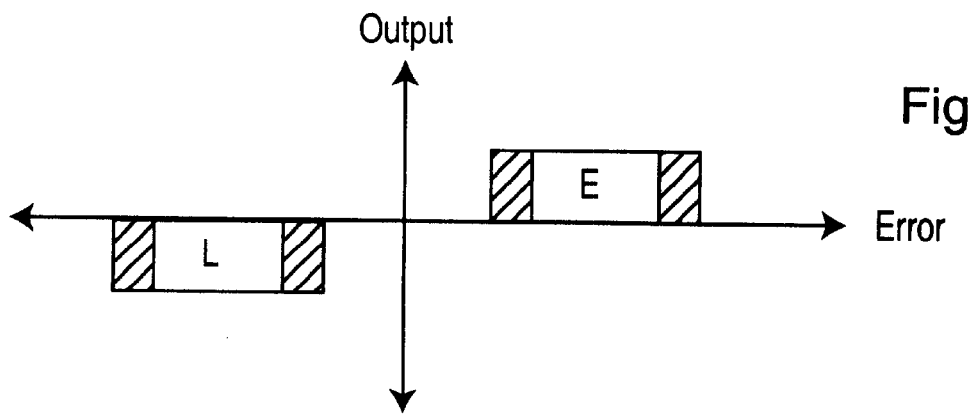
FIG. 9C is a graph of a transfer function illustrating how unneeded fluctuations of phase adjustment are eliminated or reduced by the introduction of a dead zone.

FIG. 9C illustrates the transfer characteristics with the introduction of the dead zone. As the overlap of O region with each of L and E regions is eliminated, time error detector 330 may have a steady state which corresponds to zero timing error.

Some factors to be considered in the choice of width of the dead zone are noted now. The wider the dead zone, the smaller amount of fluctuations will be seen during the operation. However, the dead zone may not be made too wide as the detector gain and accuracy will be reduced, thereby negatively affecting the performance of time error detector 330.

With the introduction of the dead-zone, the aperture (AP), including uncertainty, can be given by:

$$t0+2t1<AP<t0+2(t1+t2) \qquad \text{Equation (2)}$$

wherein t0 is the nominal width of the dead zone not including uncertainty (i.e. this is a length of additional delay inserted for the dead-zone).

This is a conservative estimate of the aperture width; it assumes the uncertainty of 50% which means the detector transfer characteristic is silted (filled up) with the uncertainty. However, the uncertainty can be reduced by appropriate design. In an embodiment, uncertainty is maintained to be no more than 20 to 25% by selecting the sampling period and comparator sensitivity properly. The estimation of the aperture in such embodiments can be given by:

$$t0+2t1+t2<AP<t0+2(t1+t2) \qquad \text{Equation (3)}$$

Due to the overlap, the effective dead zone width is also uncertain and can be estimated as:

$$t0+t1<DZ<t0+2t1 \qquad \text{Equation (4)}$$

if the above mentioned recommendation about uncertainty level is adhered to.

Thus, the dead zone provides a convenient way of adjusting the aperture width of time error detector 330 depending on the system conditions. An embodiment of time error detector using the dead zone to eliminate/reduce the uncertainty is described below with reference to FIG. 10.

11. Time Error Detector

Figure 10:
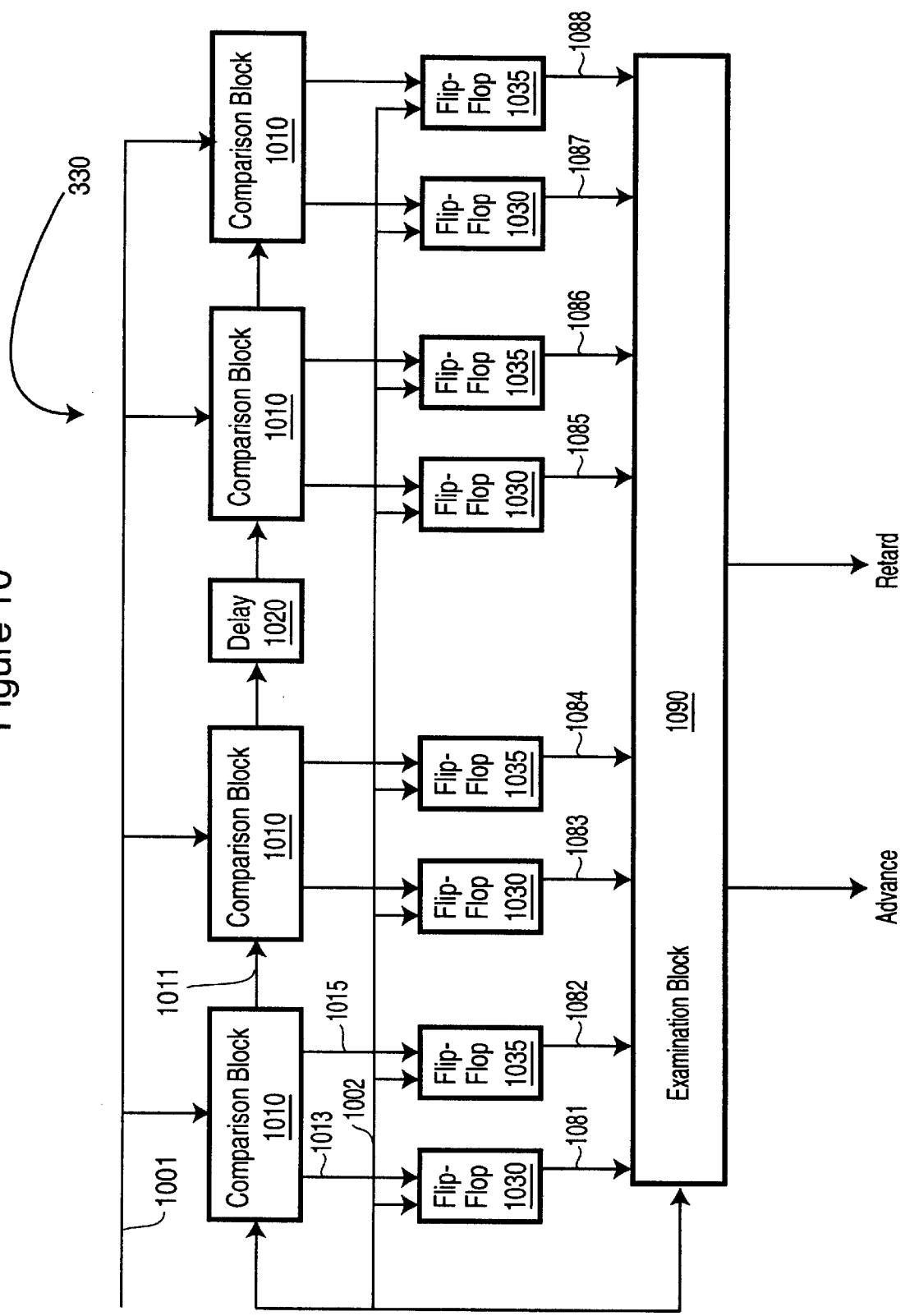
FIG. 10 is a block diagram illustrating an example implementation of a phase error detector.

FIG. 10 is a block diagram illustrating the details of an embodiment of time error detector 330. Time error detector 330 may include phase comparison blocks (each designated as 1010), delay element 1020, eight flip-flops (four designated as 1030 and four designated as 1035), and examination block 1090. Time error detector 330 may receive display data signal and input clock signal on lines 1001 and 1002 respectively.

Each of the four comparison blocks 1010 may be implemented using the circuits illustrated with reference to FIGS. 7 or 8. However, the description in FIG. 10 is with reference to the embodiment(s) of FIG. 8. Thus, each comparison block 1010 samples analog display data received on line 1001 twice at an interval determined by the internal delay (not shown in FIG. 10, but shown in FIG. 8), and generates two bit (1013 and 1015) indicating whether the analog display data is rising, falling or flat based on the two timing samples.

Delay 920 operates to introduce the time delay in the clock signals representing dead zone towards the middle of the aperture. As noted above, the dead zone may lead to more predictability in the operation of the time error detector when no phase correction needs to be made. Delay 920 may be implemented in a known way.

Flip-flops 1030 and 1035 store the two bits (1013 and 1015) representing whether the analog display signal is rising, falling or flat from corresponding comparison block 1010. Clock signal 1013 synchronizes the availability of the bits in flip-flops 1035 and 1030 as each comparison block may generate the two bits with a small time lag within a clock cycle of clock signal 1002.

Examination block 1090 examines the outputs of flip-flops 1030 and 1035 to determine whether the sampling phase has to be advanced or retarded. If neither of the signals is asserted, no phase adjustment may need to be performed. Examination block 1090 may include one of several structures which examines the data stored in flip-flops 1030 and 1035, and indicates whether to change the phase of sampling clock 351.

In one embodiment, examination block 1090 may be implemented to operate in one of two modes—aggressive (A) and conservative (C). If set in aggressive mode, transition patterns like rising/flat/rising are analyzed and the timing information is extracted from the flat region. In a conservative approach, timing information is extracted from the steady area only if the difference sign is changing around the steady state (for example, the pattern rising/steady/falling will be detected and used, but falling/steady/falling will be not).

Appendix includes the patterns which may be determined in the embodiment. In the text there, '–' sign indicates that the signal is falling, '+' sign indicates that the signal is rising, and '0' indicates that the signal is flat. Pattern '–000' with number 0 indicates that the first two samples indicate that the signal is falling, and the remaining samples indicate that the display data signal is flat. The corresponding action is to advance the phase of sampling clock 351. This would be the result in both the conservative and aggressive modes as indicated by the text 'Mode B'.

In pattern '–0–0' with number 4, the phase is advanced only in the aggressive (A) mode, but not the conservative (C) mode. In pattern '+–0–' numbered 19, the sampling phase is advanced only in the conservative (C) mode, but not in the aggressive mode (A). In patterns 1–3, the phase is advanced in both conservative and aggressive (shown as mode B) modes. All the 40 patterns in the appendix are described similarly. The remaining patterns may be ignored in that embodiment.

It should be noted that the choice of modes, actions corresponding to different action, etc., are described here merely for illustration. Other variations may be determined for specific environments as will be apparent to one skilled in the relevant arts based on the disclosure herein. An example embodiment of examination block is described below in further detail.

12. Examination Block

Figure 11A:
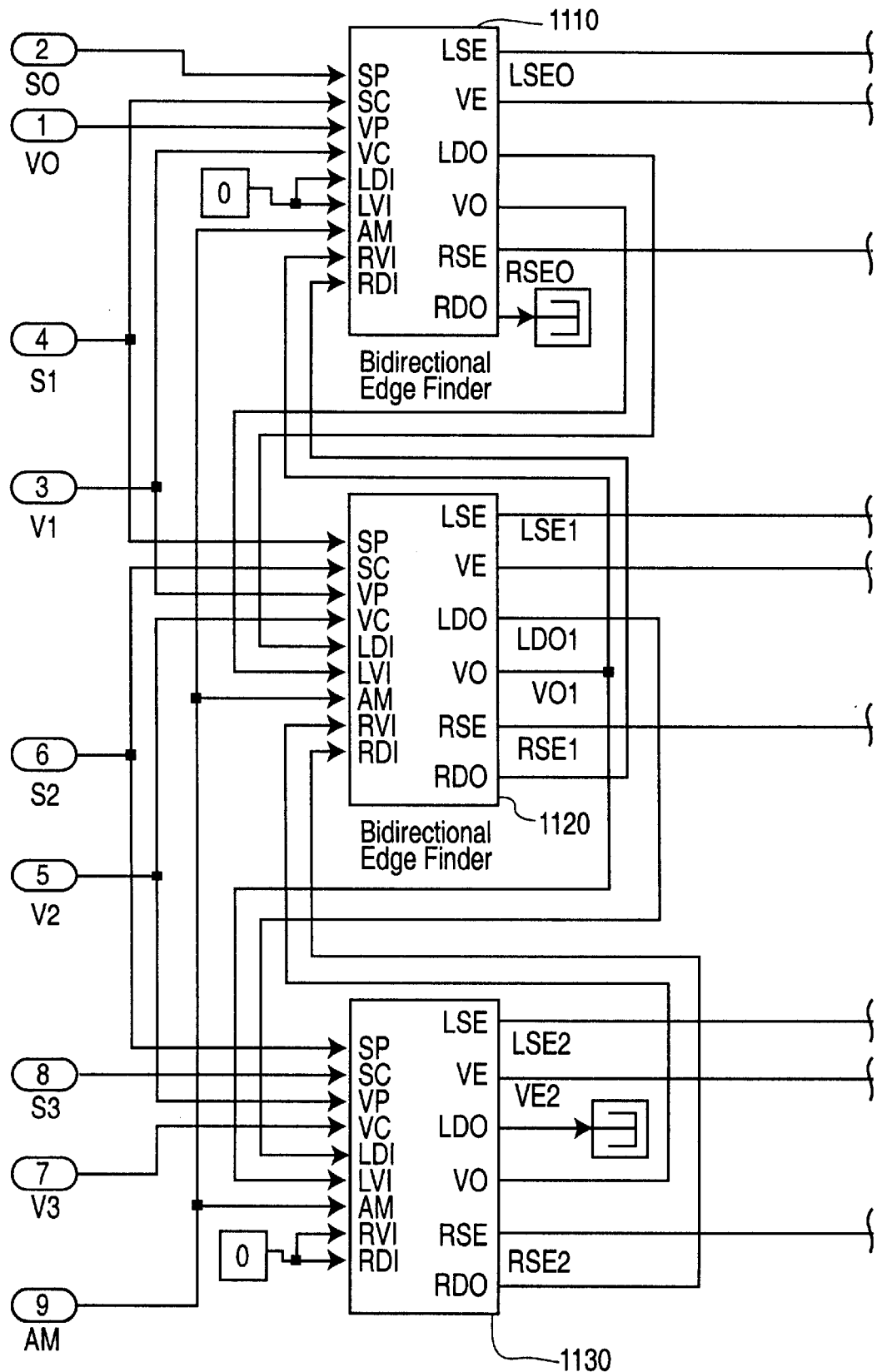
FIG. 11 is a block diagram illustrating an example implementation of a examination block, which generates retard and advance signals by examining the results of comparisons of successive samples on a display data image signal of a pixel data element.
Figure 11B:
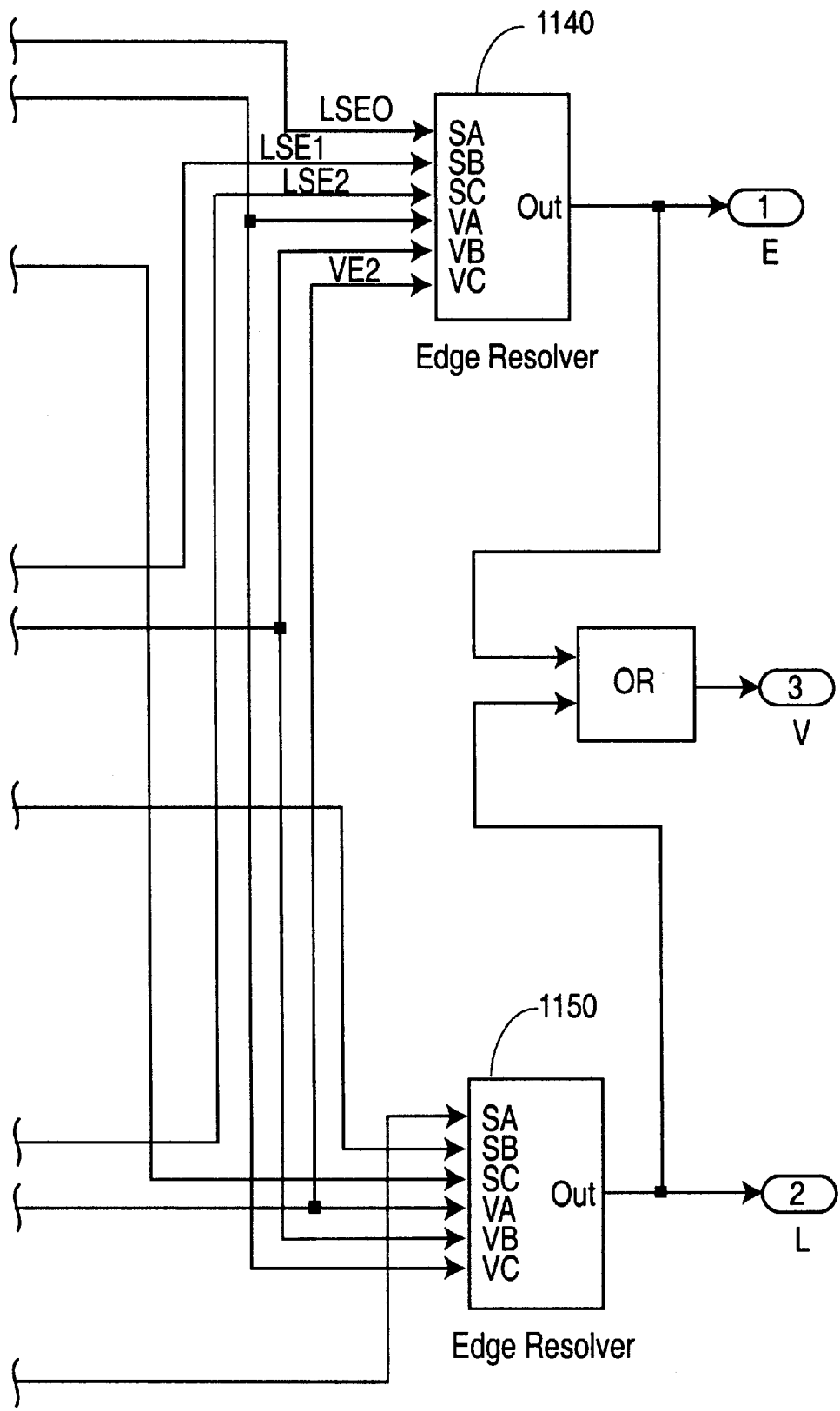

FIG. 11 is a block diagram illustrating an example implementation of examination block 1090, which generates the results of Appendix. The example embodiments described herein examine only a small area of the analog display data while adjusting the phase of the sampling clock. The eight inputs (S0–S3 and V0–V3) from flip-flops 1030 and 1035 of FIG. 10. Examination block 1090 may contain three edge finder blocks 1110, 1120 and 1130, and two edge resolver blocks 1140 and 1150. The blocks are described below in further detail.

In the embodiments described herein, edge finders are implemented as bi-directional edge finders, which analyze the timing samples in both forward and reverse direction (on a time scale). Accordingly, some of the output signals (e.g., VO1 output of edge finder 1120) are shown being used by the block above (edge finder 1110) and the block below (edge finder 1130). Due to the bi-directional implementation, the processing of comparison results may yield symmetric results.

That is, if a given type of pattern causes the sampling clock phase to be advanced, another pattern which is similar when viewed in the reverse direction causes the sampling clock phase to be retarded. As an illustration, with reference to the Appendix, while comparison patterns '–000 and +000' require that the phase of the sampling clock be advanced, comparison patterns of '000– and 000+' require that the phase of the sampling clock be retarded. Similarly, while patterns '+0–0 and –0+0' cause the phase of the sampling clock to be advanced, patterns '0–0+ and 0+0–' cause the phase of the sampling clock to be retarded.

Broadly, the edge finder blocks together receive the difference values for each pair of samples, and analyze the samples for possible transitions between rising/flat/falling cases. The edge resolver layer (with multiple blocks) analyzes the output of edge finding layer (containing multiple edge finder blocks) and resolves any ambiguity which may arise during such an analysis. The output of edge resolving layer may consist of two signals: Early (E) and Late (L). The V (valid output signal) may be used for simulation and debugging. Edge resolver block 1140 and edge finder block 1110 are described below in further detail.

Each edge finder is shown with nine input signals (SP, SC, VP, VC, LDI, LVI, AM, RVI and RDI) and six outputs (LSE, VE, LDO, VO, RSE, and RDO). When necessary to distinguish among the outputs of the three edge finders, the outputs of edge finders 1110, 1120, and 1130 are appended with '0', '1' and '2' respectively. For conciseness, edge finders 1110, 1120 and 1130 are described below with reference to edge finder 1110, and edge resolvers 1140 and 1150 are described below with reference to edge resolver 1140. The inputs and outputs of edge finder 1110 are described below in further detail.

SP input indicates whether a later timing sample on analog display data is falling (=0) or rising (=1) in reference to the earlier sample. That is, with reference to FIG. 6A, SP input of edge finder 1110 (SO) may have a value of 1 as sample 612 is greater in value in comparison to sample 612. The SC input of edge finder 1110 may also have a value of 1 as sample 613 is greater in value in comparison to sample 614. It may be noted that 'P' and 'C' in SP and SC respectively, refer to previous and current. Similar terminology is used in denoting other inputs also.

VP and VC inputs indicate whether the display data signal is changing (=1) or flat (=0) for the previous and current (present) comparisons. In the case of FIG. 6A, the V0 and V1 inputs may be set to 1 as the signal level is changing as determined by the comparison of corresponding timing samples.

The AM input indicates whether the phase adjustment operates in aggressive mode or conservative mode. In general, aggressive mode may be designed to extract timing information in more situations than in conservative mode. Specifically, when examination of aperture does not clearly show a transition indicative of the boundary of display signal portions of successive pixel data elements. Such unclarity may exist, for example, when successive pixels have approximately equal values (e.g., at 515 in FIG. 5). In such situations, as the rate of change may be minimal, a flat (indicated by 0 in the patterns of appendix A) result (of comparing two timing samples) may be reasonably viewed as the boundary even if the earlier and later portions surrounding the flat portion are rising.

Continuing with the description of the aggressive mode, in another situation, a flat signal may be deemed to exist because of the thresholds present in the comparators. As noted above, comparators may determine a signal to be flat if the difference of the timing samples does not exceed a pre-set threshold. Thus, when a signal level is increasing slowly, two timing samples may indicate that the signal is flat even though the signal level may be changing, and a later comparison may in fact show that change. Accordingly, timing information may be extracted even based on assumptions about the flat areas.

On the other hand, in a conservative mode, the boundaries are determinable with precision. Clarity of boundaries have been illustrated with reference to FIGS. 6A–6F above. In summary, patterns such as a flat portion following by rising or falling signal, a rising signal followed by a falling signal and vice versa, a falling or rising signal followed by flat portion, are examples which provide clear boundaries. In addition, due to the thresholds considerations noted in the description above (including preceding paragraph), a flat portion may be deemed to be a continuation of a falling or rising signal. For example, in pattern 19 of Appendix A, '+−0−' pattern may be viewed as rising signal followed by a falling signal in spite of the presence of the 0 (flat portion) in between the two '−' signs.

Continuing with the description of the inputs of edge finders of FIG. 11, the LDI, LVI, RDI, and RVI inputs are connected to VO output of the adjacent blocks. Specifically, L or R in the first character represents whether the output of the edge finder of the left (processing earlier timing samples) or right (processing later timing samples) is connected. The D or V in the second position represent the LDO and VO outputs respectively of the corresponding edge finder.

When an edge finder block to the left is absent (e.g., for edge finder 1110), the inputs are set to 0. Inputs RDI and RVI represent the D/V carry input from an edge finder at the right (block processing a pair of later samples). When the right edge finder is not present (for edge 1130), the inputs are set to 0. The VO output of each edge finder is described below in further detail.

Each edge finder block may have five outputs, which are described with example reference to Tables B1–B3 of Appendix B. VO (Valid Out) may be set to 1 to indicate that the signal examined by the edge finder is changing (rising or falling) and set to 0 to indicate that the signal in this block (based on three timing samples) was flat. As may be appreciated, VO is generated based on examination of the three timing samples. Thus, in Table B1 corresponding to pattern '−+00', the three edge finders have an output of 1, 1, and 0 respectively based on the examination of the respective two data points (or three timing samples) in the pattern.

The VE (variance edge) output signal marks change between steady/not steady conditions (in any direction). Thus, when only one of the two data points is a '0' (steady or flat), the VE output is set to 1 as may be observed from the VE entry of Table B1. Otherwise, the VE output is set to 0.

The LSE output marks the a change in the sign of derivative when the input signal is viewed from left to right. That is, when the direction (falling, rising or flat) changes when viewed from left to right (on a time domain), the LSE output is set to 1. Thus, the LSE0 output is set to 1 for pattern −+00 (see Table B1), LSE1 is set to 1 for pattern +0−0 (table B2), etc. RSE output is described similarly, with a change in the sign of the derivative when the signal is examined from right to left.

Figure 12:
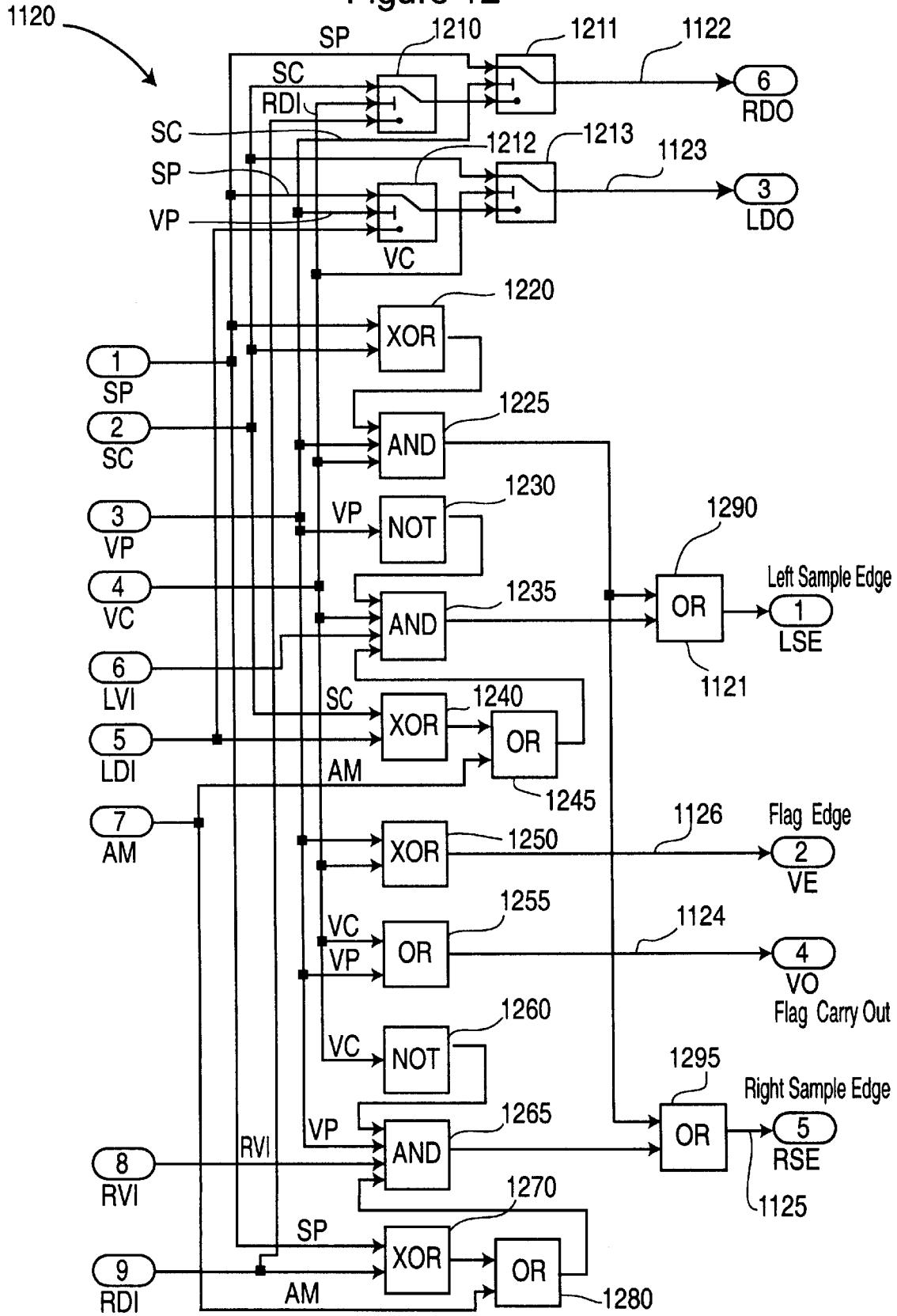
FIG. 12 is a block diagram illustrating an example implementation of an edge finder block.

The LDO (left difference output) and RDO (right difference output) are used to propagate the LDI and RDI inputs respectively when the signal if flat based on examination of the three timing signals. If the signal is not flat, the SP or VP input is generated as output depending on the VP and VC inputs. An embodiment of edge finder is described below with reference to FIG. 12 in further detail.

Edge resolver 1140 receives the LSE outputs (LSE0, LSE1, and LSE2) and VO outputs (V01, V02, and V03) SA, SB, SC, VA, VB, and VC inputs respectively. Edge resolver 110 generates an 'Early' signal by examining the six input signals. These two signals are symmetric around the center of the aperture. Thus, the same resolver may be used if the input signals are mirrored. For example, Early condition uses signals from edge finders 0,1,2 (in this order). The Late condition is based on inputs from edge finders 2,1,0 because of the symmetry.

To achieve true symmetry, the bidirectional carry chain between edge finder blocks is used. Thus, for the Early case, outputs based on the Left to Right carry is used, and for the Late case, the outputs based on the right to left carry are appropriate. This feature insures the symmetry of the aperture. Example implementations of edge finder block 1110 and edge detector 1140 are described below in further detail.

13. Edge Finder Block

The implementation of edge finder blocks is described with reference to the middle block 1120. Edge finder block 1120 may contain four multiplexors 1210–1213, XOR gates 1120, 1240, 1250 and 1270, AND gates 1225, 1235 and 1265, OR gates 1245, 1255, 1280, 1290 and 1295, and NOT gates (inverters) 1230 and 1260.

Each of multiplexors 1210–1213 receives two inputs, and gates the input shown at the top when the middle input is equal to 0 and the bottom input when the middle input is equal to 1. Multiplexors 1210 and 1211 propagate difference carry right-to-left. If one or both comparison intervals are not steady (flat), the difference sign is taken from the interval closest to the right. Otherwise (if both are steady), the difference is propagated from RDI to RDO (i.e. the difference carry is propagated from right neighbor to the left one).

The operation of multiplexors 1212 and 1213 is described similarly. The left most non-steady comparison is propagated left-to-right (if any). Otherwise, LDI is propagated to LDO (left neighbor to the right one).

The rest of the circuit is described first broadly. The implementation and design are described below in further detail. NOT gate (inverter) 1230, AND gate 1235, XOR gate 1240 and OR gate 1245 form a left-to-right conditional difference sign edge detector. NOT gate 1260, AND gate 1265, XOR gate 1270 and OR gate 1280 form a right-to-left conditional difference edge detector. Both conditional difference edge detectors detect the edge only if one or two comparisons are steady. If both comparisons aren't steady, unconditional difference edge detector formed by XOR 1220 and AND gate 1225 marks the edge if difference sign changes from one comparison to another. OR gates 1290 and 1295 combine unconditional edge with appropriate conditional one.

Now the interconnections are described in further detail. XOR 1220 generates a 1 as an output if only one of SP and SC inputs is equal to 1, and a 0 as an output otherwise. AND gate 1225 receives the output of XOR 1220, VP 1084 and VC 1086 as inputs. NOT gate 1230 receives VP 1084 as input. AND gates 1235 receives output of NOT gate 1230, VC 1086, LVI 1114, and output of OR gate 1245 as inputs. XOR gate 1240 receives SC 1086 and LDI 1113 as inputs. OR gate 1245 receives the output of XOR 1240 and aggressive mode (AM) indicator 1101 as inputs.

XOR gate 1250 receives VP 1084 and VC 1086 as inputs. OR gate 1255 receives VC 1086 and VP 1084 as inputs. NOT gate 1260 receives VC 1086 as input. AND gate 1265 receives as inputs the output of NOT gate 1260, VP 1084, RVI 1136 and output of OR gate 1280. XOR gate 1270 receives as inputs SP 1083 and RDI 1134. OR gate 1280 receives as inputs the output of XOR gate 1270 and AM indicator 1101. OR gate 1290 receives as inputs the output of AND gate 1225 and AND gate 1235. OR gate 1295 receives as inputs the output of AND gates 1225 and 1265.

With the interconnections described above, the outputs of multiplexor 1211, multiplexor 1213, OR gate 1290, XOR 1250, XOR 1255, and OR 1295 respectively represent RDO 1122, LDO 1123, LSE 1121, VE 1126, VO 1124, and RSE 1125. Some of these outputs may be processed further by edge resolver as described below.

14. Edge Resolver Block

Figure 13:
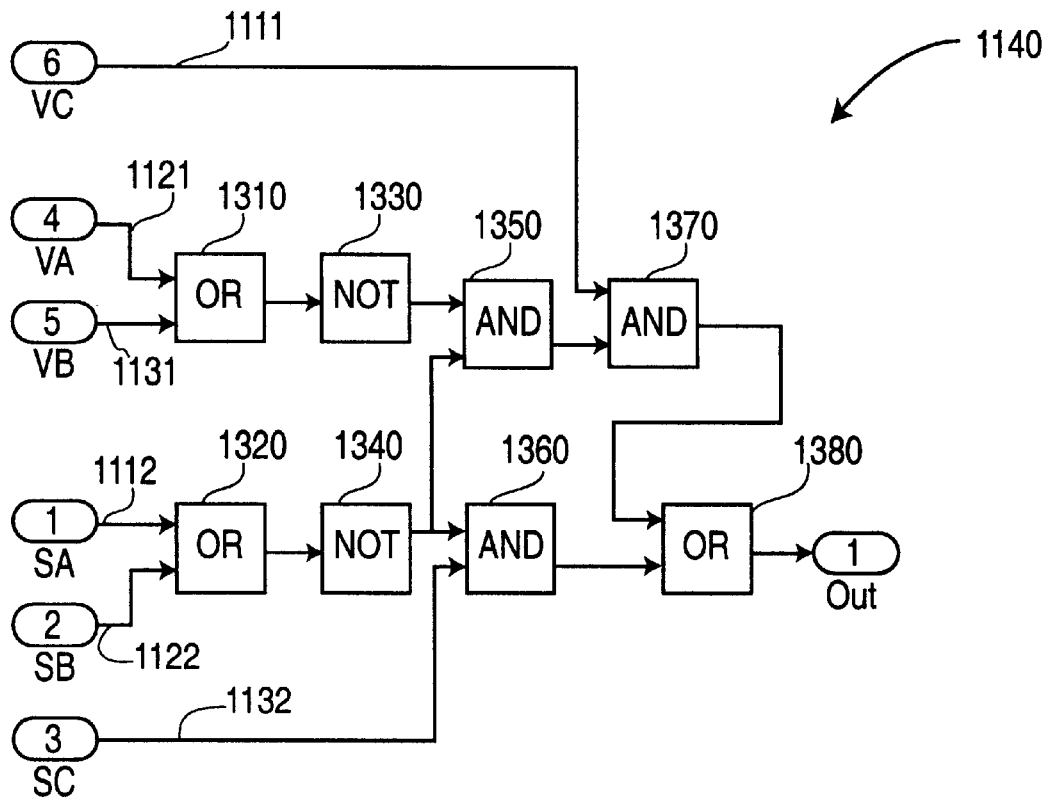
FIG. 13 is a block diagram illustrating an example implementation of a edge resolver block.

FIG. 13 is a block diagram illustrating an example implementation of edge resolver (1140 or 1150) containing OR gates 1310 and 1320, NOT gates 1330 and 1340, AND gates 1350, 1360 and 1370, and OR gate 1380. OR gate 1310 receives lines 1121 and 1131 as inputs. In the case of edge resolver 1140, which examines the timing samples from left to right, the output (OUT) represents an EARLY state, which implies that the phase of the sampling clock needs to be retarded. In the case of edge resolver 1150, which examines the timing samples from right to left, the output (OUT) represents a LATE state, which implies that the phase of the sampling clock needs to be advanced. The circuit is described in further detail below.

Broadly, the output (OUT) is asserted if difference sign is changing between B and C or if there is a change in difference variance between B and C. The first condition is determined by OR gate 1320, NOT gate 1340, and AND gate 1360, while the second condition is determined by OR gate 1310, NOT gate 1330, and AND gates 1350 and 1370. OR gate 1380 combines two cases (sign and variance).

Thus, for left-to-right carry (edge resolver 1140), the change in difference sign or variance between last two sampling intervals may cause EARLY state recognition. For right-to-left carry (edge resolver 1150), the change in sign or variance between two first two intervals may be recognized as LATE state.

Specifically, OR gate 1320 receives SA and SB as inputs. NOT gates 1330 and 1340 respectively receive the outputs of OR gates 1310 and 1340. AND gate 1350 receives the output of NOT gates 1330 and 1340. AND gate 1360 receives as inputs the output of NOT gate 1340 and line 1132. AND gate 1360 receives as inputs line 1111 and the output of AND gate 1350. OR gate 1380 receives as inputs the output of AND gates 1370 and 1360. The output of OR gate 1380 represents the Early signal.

Similarly, the output of edge detector 1150 may be implemented to generate the Late signal. When an Early signal is generated, the corresponding action is to retard the phase of the sampling clock 351. When a Late signal is generated, the corresponding action is to advance the phase of sampling clock 351. The advance and retard indications can be used in one of several ways. Assuming that the indications are merely pulses with equal duration, an example embodiment phase adjuster 330 is described below.

15. Phase Adjuster

Figure 14:
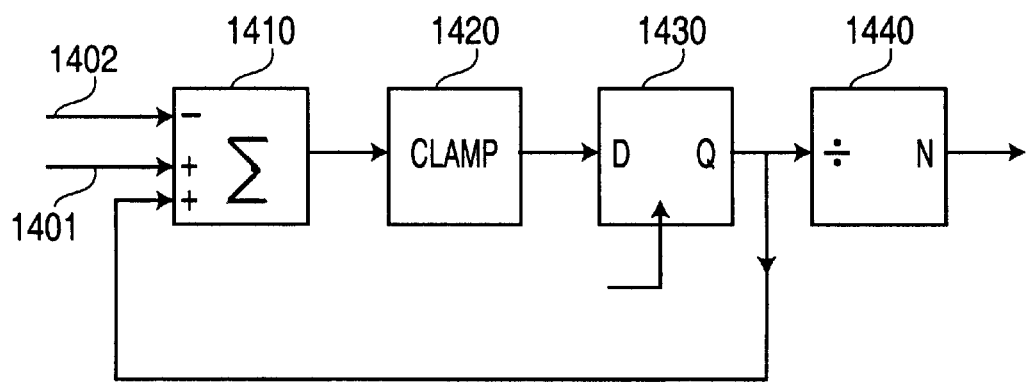
FIG. 14 is a block diagram illustrating an example implementation of a phase adjuster.

FIG. 14 is block diagram illustrating the details of phase adjuster 330 in one embodiment. Phase adjuster 330 may include adder 1410, clamp 1420, delay flip-flop 1430, and divider 1440. Adder 1410 receives a retard pulse on line 1401 and an advance pulse on line 1402 representing situations when the phase of the sampling clock needs to be retarded and advanced respectively. Adder 1410 further receives the output of flip-flop 1430 as another input.

Clamp 1420 may operate to provide appropriate phase correction when adder 1410 overflows or underflows. Clamp 1420 is generally designed to avoid the wrap-around of the integrator during over-flow or under-flow of adder, and may be implemented in a known way. Delay 1430 stores the output of limit and clamp 1430. Delay 1430 may be reset by synchronization signal pulses. Divider 1440 divides the number stored in delay 1430, and provides the output to variable delay 350. Divider 1440 controls the gain of the integrator.

Variable delay 350 may delay synchronization clock signal 345 according to the output generated by divider 1440. As the delay is designed to correct the deviation of the synchronized clock signal 345 from the source clock signal, the sampling clock generated to ADC 310 may closely track the source clock signal.

The tracking mechanism may also be implemented different than that of the description of above. For example, in between the detector correction pulses (advance/retard indication), two ways of implementation may be used: (1) non-decaying case, and (2) decaying case. In the non-decaying case, the tracking mechanism is held in the state corresponding to the last advance/retard pulse and no phase adjustment may be made in between the pulses. This method may be advantageous in some cases because if the phase of the incoming display data signal is changing slowly, the overall phase error of the system will be smaller compared to the other way. However, if the phase is changing rapidly and/or period between the correction pulses is large, the resulting phase error may be substantially large when compared to decaying case.

In the decaying case, the phase correction may be made to decay slowly toward the zero in between the correction pulses. The speed of decay may be determined by the impulse response of the filter. In such a scheme, the filter may be updated regardless of the presence of the correction pulse. This approach is advantageous if the original source clock phase is changing rapidly and/or the spacing between the corrections is large on the average. However, for slowly changing sampling phase, the phase error of such a timing error recovery may be substantially larger compared to non-decaying case.

Briefly, in the decaying scheme, the filter may be updated every sampling clock cycle (or multiple thereof). In contrast, the non-decaying scheme updates the filter only if correction pulse from the detector is present. The choice between these two methods is system-dependent and in some systems both methods maybe utilized with automatic or manual switching between the methods. In either case, the filter response is then applied to the adjustable delay (analog or digital) which delays the sampling clock phase with respect to the clock recovered from the sync pulses.

Thus, the present invention provides for several embodiments, which can be used to accurately adjust the phase of a sampling clock used for recovering pixel data elements encoded in an analog display signal.

16. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

APPENDIX A

| | | |
|---|---|---|
| 0: | -000 | ->Mode B, Action Advance |
| 1: | +000 | ->Mode B, Action Advance |
| 2: | +-00 | ->Mode B, Action Advance |
| 3: | -+00 | ->Mode B, Action Advance |
| 4: | -0-0 | ->Mode A, Action Advance |
| 5: | +0-0 | ->Mode B, Action Advance |
| 6: | -0+0 | ->Mode B, Action Advance |
| 7: | +0+0 | ->Mode A, Action Advance |
| 8: | ---0 | ->Mode B, Action Retard |
| 9: | +--0 | ->Mode B, Action Advance |
| 10: | -++0 | ->Mode B, Action Advance |
| 11: | +++0 | ->Mode B, Action Retard |
| 12: | 000- | ->Mode B, Action Retard |
| 13: | 000+ | ->Mode B, Action Retard |
| 14: | 0-0- | ->Mode A, Action Retard |
| 15: | 0+0- | ->Mode B, Action Retard |
| 16: | 0-0+ | ->Mode B, Action Retard |
| 17: | 0+0+ | ->Mode A, Action Retard |
| 18: | --0- | ->Mode A, Action Retard |
| 19: | +-0- | ->Mode C, Action Advance |
| 20: | ++0- | ->Mode B, Action Advance |
| 21: | --0+ | ->Mode B, Action Retard |
| 22: | -+0+ | ->Mode C, Action Advance |
| 23: | ++0+ | ->Mode A, Action Retard |
| 24: | 00+- | ->Mode B, Action Retard |
| 25: | 00-+ | ->Mode B, Action Retard |
| 26: | -0-- | ->Mode A, Action Advance |
| 27: | +0-- | ->Mode B, Action Advance |
| 28: | +0+- | ->Mode C, Action Retard |
| 29: | -0-+ | ->Mode C, Action Retard |
| 30: | -0++ | ->Mode B, Action Advance |
| 31: | +0++ | ->Mode A, Action Advance |
| 32: | 0--- | ->Mode B, Action Advance |
| 33: | 0++- | ->Mode B, Action Retard |
| 34: | 0--+ | ->Mode B, Action Retard |
| 35: | 0+++ | ->Mode B, Action Advance |
| 36: | +--- | ->Mode B, Action Advance |
| 37: | +++- | ->Mode B, Action Retard |
| 38: | ---+ | ->Mode B, Action Retard |
| 39: | -+++ | ->Mode B, Action Advance |

APPENDIX B

Table B1 (Input Pattern -+00)

| Output | EF0 | EF1 | EF2 |
|---|---|---|---|
| LSE | 1 | 0 | 0 |
| VE | 0 | 1 | 0 |
| LDO | 1 | 1 | 1 |
| VO | 1 | 1 | 0 |
| RSE | 1 | 0 | 0 |
| RDO | 0 | 1 | 0 |

Table B2 (Input Pattern +0-0)

| Output | EF0 | EF1 | EF2 |
|---|---|---|---|
| LSE | 0 | 1 | 0 |
| VE | 1 | 1 | 1 |
| LDO | 1 | 0 | 0 |
| VO | 1 | 1 | 1 |
| RSE | 1 | 0 | 0 |
| RDO | 1 | 0 | 0 |

Table B3 (Input Pattern 0+0+ in Aggressive Mode)

| Output | EF0 | EF1 | EF2 |
|---|---|---|---|
| LSE | 0 | 0 | 1 |
| VE | 1 | 1 | 1 |
| LDO | 1 | 1 | 1 |
| VO | 1 | 1 | 1 |
| RSE | 0 | 1 | 0 |
| RDO | 1 | 1 | 1 |

What is claimed is:

1. A method of recovering a plurality of pixel data elements encoded in a display data signal of an analog display signal, said analog display signal also containing synchronization signals associated with said display data signal, wherein said plurality of pixel data elements are encoded in said display data signal using a source clock signal, said synchronization signals not containing the timing information corresponding to the encoding of each of said plurality of pixel data elements individually, said method being performed in a display system, said method comprising the steps of:

(a) receiving said display data signal in said display system;

(b) generating a sampling clock signal;

(c) examining said display data portion to determine the deviations of said sampling clock signal from said source clock signal;

(d) adjusting the phase of said sampling clock signal according to said deviations; and (e) sampling said display data signal according to said sampling clock with the phase adjusted in step (d), wherein said sampling generates one of said plurality of pixel data elements, whereby the phase adjustment of step (d) enables said plurality of pixel data elements to be recovered accurately by the sampling of step (e).

2. The method of claim 1, wherein step (c) comprises the further step of:

(f) examining said display data signal to determine an actual boundary between display data portions representing each pair of successive pixel data elements, wherein said boundaries provide timing information of said source clock signal, wherein the phase of said sampling clock signal is adjusted according to said timing information provided by said boundaries, such that said sampling clock signal tracks said source clock signal closely.

3. The method of claim 2, wherein said sampling clock signal of step (b) is generated according to said synchronization signals, step (f) comprises the further step of:

(g) determining an expected boundary according to said synchronization signals; and (h) examining an aperture to determine said actual boundary, wherein said aperture is a small area around said expected boundary, whereby the processing required to determine said actual boundary are minimized due to said small area.

4. The method of claim 3, wherein the time difference of actual boundary and expected boundary represent said deviation, and wherein step (d) comprises the step of advancing the phase of said sampling clock if said expected boundary is determined to be earlier than said actual boundary, and retarding the phase of said sampling clock is said expected boundary is determined to be later than said actual boundary.

5. The method of claim 3, wherein step (h) comprises the further steps of:
   (i) generating a plurality of timing samples representing said aperture; and
   (j) comparing each pair of consecutive timing samples to determine said actual boundary.

6. The method of claim 5, wherein each of said plurality of timing samples comprises an analog timing sample.

7. The method of claim 6, further comprising the step of introducing a dead zone in the middle of said aperture, wherein said dead zone minimizes or eliminates uncertainties when said expected boundary is close to said actual boundary.

8. The method of claim 6, wherein step (j) comprises of generating a binary digit for each of said comparisons of step (j), wherein a first value of said binary digit indicates that said analog display data is rising and another value of said binary digit indicates that said analog display data is falling.

9. The method of claim 6, wherein the values representing the difference of each pair of said actual boundary and said expected boundary is passed through a filter, and the output of said filter is used to adjust the phase of the sampling clock in step (e).

10. The method of claim 6, wherein step (j) comprises of generating at least three states to indicate whether said display data signal is rising or flat or falling at the compared two points.

11. The method of claim 10, wherein said display data portion is determined to be raising or falling only if the difference in voltage level of analog timing samples exceeds a threshold level.

12. The method of claim 11, wherein five analog timing samples are taken in said aperture.

13. The method of claim 6, wherein said synchronization signals comprise horizontal synchronization signals.

14. A circuit in a display unit, said circuit being designed to recover a plurality of pixel data elements encoded in a display data signal of an analog display signal, said analog display signal also containing synchronization signals associated with said display data signal, said circuit comprising:
   an analog to digital converter (ADC) to receive said display data signal, said ADC sampling said display data signal according to a sampling clock signal;
   a clock generator to generate said sampling clock signal based on said synchronization signals;
   a time error detector to examine said display data portion to determine the deviations of said sampling clock signal from said source clock signal;
   a phase adjustment circuit to adjust the phase of said sampling clock signal according to said deviations such that said sampling clock signal tracks said source clock signal closely,
   whereby the phase adjustment enables said plurality of pixel data elements to be recovered accurately by said ADC.

15. The circuit of claim 14, wherein said phase adjustment circuit is designed to examine said display data signal to determine an actual boundary between display data portions representing each pair of successive pixel data elements, wherein said boundaries provide timing information of said source clock signal,
   wherein the phase of said sampling clock signal is adjusted according to said timing information provided by said boundaries, such that said sampling clock signal tracks said source clock signal closely.

16. The circuit of claim 15, wherein said clock generator generates said sampling clock signal according to said synchronization signals, and wherein said phase adjustment circuit is designed to determine an expected boundary according to said synchronization signals, and to examine an aperture to determine said actual boundary, wherein said aperture is a small area around said expected boundary, whereby the circuitry required to determine said actual boundary is minimized due to said small area.

17. The circuit of claim 15, wherein said phase adjustment circuit comprises:
   a time error detector designed to examine said aperture to determine said deviations, and
   a variable delay to receive said clock signal generated by said clock generator, said variable delay introducing a delay in said clock signal to generate said sampling clock; and
   a phase adjustor coupled to said time error detector and said variable delay, said phase adjustor receiving an indication of said deviations and to control said delay to cause said variable delay to generate said sampling clock which tracks said source clock closely.

18. The circuit of claim 17, wherein said time error detector comprises:
   a plurality of comparison blocks to examine said display data signal and generating outputs indicative at least of whether said display data signal is rising or falling; and
   an examination block coupled to receive the outputs of said comparators, said examination block determining whether to advance or retard the phase of said sampling clock based on the outputs generated by said plurality of comparators.

19. The circuit of claim 18, wherein each of said plurality of comparison blocks comprises:
   a sample and hold circuit to generate an analog timing sample, wherein the analog timing samples generated by the sample and hold circuits represents said aperture;
   a plurality of comparators, wherein each of said plurality of comparators is designed to compare a pair of consecutive timing samples to determine whether said display data signal represented by the pair of consecutive timing samples is rising or falling,
   wherein said examination block is designed to process the output of said plurality of comparators to determine whether to advance or retard the phase of said sampling clock.

20. The circuit of claim 19, further comprising a delay element between said plurality of sample and hold circuits, wherein said delay element introduces a dead zone in the middle of said aperture, wherein said dead zone minimizes or eliminates uncertainties when said expected boundary is close to said actual boundary.

21. The circuit of claim 19, wherein each of said plurality of comparators is designed to generate a binary digit, wherein a first value of said binary digit indicates that said analog display data is rising and another value of said binary digit indicates that said analog display data is falling, and wherein said examination block is designed to determine an extremum representing said actual boundary by examining the binary digits generated by said plurality of comparators.

22. The circuit of claim 19, wherein each of said comparators is designed to generate an integer to indicate whether said display data signal is rising or flat or falling based on the compared two timing samples.

23. The circuit of claim 22, wherein said display data portion is determined to be rising or falling only if the difference in voltage level of analog timing samples exceeds a threshold level.

24. A circuit for use in a display unit, said circuit for recovering a plurality of pixel data elements encoded in a display data signal of an analog display signal, said analog display signal also containing synchronization signals associated with said display data signal, said circuit comprising:

receiving means for receiving said display data signal in said display system;

clock generation means for generating a sampling clock signal;

a first examining means for examining said display data portion to determine the deviations of said sampling clock signal from said source clock signal;

adjustment means for adjusting the phase of said sampling clock signal according to said deviations; and sampling means for sampling said display data signal according to said sampling clock with the phase adjusted by said adjustment means, wherein said sampling generates one of said plurality of pixel data elements, whereby the phase adjustment enables said plurality of pixel data elements to be recovered accurately.

25. The circuit of claim 24, wherein said first examining means comprises:

a second examining means for examining said display data signal to determine an actual boundary between display data portions representing each pair of successive pixel data elements, wherein said boundaries provide timing information of said source clock signal, wherein the phase of said sampling clock signal is adjusted according to said timing information provided by said boundaries, such that said sampling clock signal tracks said source clock signal closely.

26. The circuit of claim 25, wherein said clock generator means generates said sampling clock according to said synchronization signals, said second examining means further comprising:

means for determining an expected boundary according to said synchronization signals; and means for examining an aperture to determine said actual boundary, wherein said aperture is a small area around said expected boundary, whereby the processing steps required for determining said actual boundary are minimized due to said small area.

27. A digital display unit to display the images encoded in an analog display signal, said analog display signal containing a display data signal and associated synchronization signals, said images being encoded in said display data signal using a source clock signal, said digital display unit comprising:

a digital display screen to display said images;

an analog to digital converter (ADC) to receive said display data signal, said ADC sampling said display data signal according to a sampling clock signal to generate a plurality of pixel data elements representing said images;

a clock generator to generate said sampling clock based on said synchronization signals;

a time error detector to examine said display data portion to determine the deviations of said sampling clock signal from said source clock signal;

a phase adjustment circuit to adjust the phase of said sampling clock signal according to said deviations such that said sampling clock signal tracks said source clock signal closely; and a panel interface to receive said plurality of pixel data elements and to cause said digital display screen to display said images on digital display screen, whereby the phase adjustment enables said plurality of pixel data elements to be recovered accurately by said ADC, and whereby said images are accurately reproduced on said digital display screen.

\* \* \* \* \*